(12) United States Patent
McCormack et al.

(10) Patent No.: US 9,722,667 B2
(45) Date of Patent: Aug. 1, 2017

(54) PROXIMITY SENSING USING EHF SIGNALS

(71) Applicant: Keyssa, Inc., Campbell, CA (US)

(72) Inventors: Gary Davis McCormack, Tigard, OR (US); Ian A. Kyles, West Linn, OR (US)

(73) Assignee: Keyssa, Inc., Campbell, CA (US)

( * ) Notice: Subject to any disclaimer, the term of this patent is extended or adjusted under 35 U.S.C. 154(b) by 0 days.

(21) Appl. No.: 15/263,362

(22) Filed: Sep. 12, 2016

(65) Prior Publication Data

US 2016/0380676 A1     Dec. 29, 2016

Related U.S. Application Data

(63) Continuation of application No. 14/881,901, filed on Oct. 13, 2015, now Pat. No. 9,444,523, which is a (Continued)

(51) Int. Cl.
*G01R 27/26* (2006.01)
*H04B 5/00* (2006.01)
(Continued)

(52) U.S. Cl.
CPC ............ *H04B 5/0025* (2013.01); *G01S 13/04* (2013.01); *G01S 13/08* (2013.01); *H04B 5/00* (2013.01);
(Continued)

(58) Field of Classification Search
CPC ........ H04B 5/0025; H04B 5/00; H04B 5/005; G01S 13/04; G01S 13/08
See application file for complete search history.

(56) References Cited

U.S. PATENT DOCUMENTS 2,753,551 A    7/1956   Richmond
3,796,831 A    3/1974   Bauer
(Continued)

FOREIGN PATENT DOCUMENTS

CN    2237914 Y    10/1996
CN    1178402 A    4/1998
(Continued)

OTHER PUBLICATIONS

Bluetooth Audio Dongle Receiver 3.5mm Stereo, Feb. 8, 2013.
(Continued)

*Primary Examiner* — Daniel Miller
(74) *Attorney, Agent, or Firm* — Fenwick & West LLP

(57) ABSTRACT

A system for sensing proximity using EHF signals may include a communication circuit configured to transmit via a transducer an EM signal at an EHF frequency, and a proximity sensing circuit configured to sense a nearby transducer field-modifying object by detecting characteristics of a signal within the communication circuit. A system for determining distance using EHF signals may include a detecting circuit coupled to a transmitting communication circuit and a receiving communication circuit, both communication circuits being mounted on a first surface. The transmitting communication circuit may transmit a signal toward a second surface, and the receiving communication circuit may receive a signal relayed from the second surface. The detecting circuit may determine distance between the first surface and a second surface based on propagation characteristics of the signals.

16 Claims, 7 Drawing Sheets

Related U.S. Application Data continuation of application No. 13/524,956, filed on Jun. 15, 2012, now Pat. No. 9,322,904.

(60) Provisional application No. 61/497,192, filed on Jun. 15, 2011.

(51) Int. Cl.
 *G01S 13/04* (2006.01)
 *G01S 13/08* (2006.01)

(52) U.S. Cl.
 CPC .... *H04B 5/005* (2013.01); *H01L 2224/48227* (2013.01); *H01L 2224/49111* (2013.01); *H01L 2224/49113* (2013.01); *H01L 2224/49171* (2013.01); *H01L 2924/181* (2013.01); *H01L 2924/3011* (2013.01); *H01L 2924/30111* (2013.01)

(56) References Cited

U.S. PATENT DOCUMENTS

| | | |
|---|---|---|
| 3,971,930 A | 7/1976 | Fitzmaurice et al. |
| 3,987,365 A | 10/1976 | Okada et al. |
| 4,293,833 A | 10/1981 | Popa |
| 4,485,312 A | 11/1984 | Kusakabe et al. |
| 4,497,068 A | 1/1985 | Fischer |
| 4,525,693 A | 6/1985 | Suzuki et al. |
| 4,694,504 A | 9/1987 | Porter et al. |
| 4,771,294 A | 9/1988 | Wasilousky |
| 4,800,350 A | 1/1989 | Bridges et al. |
| 4,875,026 A | 10/1989 | Walter et al. |
| 4,946,237 A | 8/1990 | Arroyo et al. |
| 5,164,942 A | 11/1992 | Kamerman et al. |
| 5,199,086 A | 3/1993 | Johnson et al. |
| 5,471,668 A | 11/1995 | Soenen et al. |
| 5,543,808 A | 8/1996 | Feigenbaum et al. |
| 5,621,913 A | 4/1997 | Tuttle et al. |
| 5,749,052 A | 5/1998 | Hidem et al. |
| 5,754,948 A | 5/1998 | Metze |
| 5,773,878 A | 6/1998 | Lim et al. |
| 5,786,626 A | 7/1998 | Brady et al. |
| 5,861,782 A | 1/1999 | Saitoh |
| 5,921,783 A | 7/1999 | Fritsch et al. |
| 5,941,729 A | 8/1999 | Sri-Jayantha |
| 5,943,374 A | 8/1999 | Kokuryo et al. |
| 5,956,626 A | 9/1999 | Kaschke et al. |
| 6,011,785 A | 1/2000 | Carney |
| 6,072,433 A | 6/2000 | Young et al. |
| 6,252,767 B1 | 6/2001 | Carlson |
| 6,351,237 B1 | 2/2002 | Martek et al. |
| 6,373,447 B1 | 4/2002 | Rostoker et al. |
| 6,490,443 B1 | 12/2002 | Freeny, Jr. |
| 6,492,973 B1 | 12/2002 | Kuroki et al. |
| 6,534,784 B2 | 3/2003 | Eliasson et al. |
| 6,542,720 B1 | 4/2003 | Tandy |
| 6,590,544 B1 | 7/2003 | Filipovic |
| 6,607,136 B1 | 8/2003 | Alsman et al. |
| 6,628,178 B2 | 9/2003 | Uchikoba |
| 6,647,246 B1 | 11/2003 | Lu |
| 6,718,163 B2 | 4/2004 | Tandy |
| 6,768,770 B1 | 7/2004 | Lipperer |
| 6,803,841 B2 | 10/2004 | Saitoh et al. |
| 6,915,529 B1 | 7/2005 | Suematsu et al. |
| 6,967,347 B2 | 11/2005 | Estes et al. |
| 7,050,763 B2 | 5/2006 | Stengel et al. |
| 7,107,019 B2 | 9/2006 | Tandy |
| 7,113,087 B1 | 9/2006 | Casebolt et al. |
| 7,213,766 B2 | 5/2007 | Ryan et al. |
| 7,311,526 B2 | 12/2007 | Rohrbach et al. |
| 7,512,395 B2 | 3/2009 | Beukema et al. |
| 7,517,222 B2 | 4/2009 | Rohrbach et al. |
| 7,593,708 B2 | 9/2009 | Tandy |
| 7,598,923 B2 | 10/2009 | Hardacker et al. |
| 7,599,427 B2 | 10/2009 | Bik |
| 7,612,630 B2 | 11/2009 | Miller |
| 7,617,342 B2 | 11/2009 | Rofougaran |
| 7,645,143 B2 | 1/2010 | Rohrbach et al. |
| 7,656,205 B2 | 2/2010 | Chen et al. |
| 7,664,461 B2 | 2/2010 | Rofougaran et al. |
| 7,667,974 B2 | 2/2010 | Nakatani et al. |
| 7,760,045 B2 | 7/2010 | Kawasaki |
| 7,761,092 B2 | 7/2010 | Desch et al. |
| 7,768,457 B2 | 8/2010 | Pettus et al. |
| 7,769,347 B2 | 8/2010 | Louberg et al. |
| 7,778,621 B2 | 8/2010 | Tandy |
| 7,791,167 B1 | 9/2010 | Rofougaran |
| 7,820,990 B2 | 10/2010 | Schroeder et al. |
| 7,840,188 B2 | 11/2010 | Kurokawa |
| 7,881,675 B1 | 2/2011 | Gazdzinski |
| 7,881,753 B2 | 2/2011 | Rofougaran |
| 7,889,022 B2 | 2/2011 | Miller |
| 7,907,924 B2 | 3/2011 | Kawasaki |
| 7,929,474 B2 | 4/2011 | Pettus et al. |
| 7,975,079 B2 | 7/2011 | Bennett et al. |
| 8,013,610 B1 | 9/2011 | Merewether et al. |
| 8,014,416 B2 | 9/2011 | Ho et al. |
| 8,023,886 B2 | 9/2011 | Rofougaran |
| 8,036,629 B2 | 10/2011 | Tandy |
| 8,041,227 B2 | 10/2011 | Holcombe et al. |
| 8,063,769 B2 | 11/2011 | Rofougaran |
| 8,081,699 B2 | 12/2011 | Siwiak et al. |
| 8,087,939 B2 | 1/2012 | Rohrbach et al. |
| 8,121,542 B2 | 2/2012 | Zack et al. |
| 8,131,645 B2 | 3/2012 | Lin et al. |
| 8,183,935 B2 | 5/2012 | Milano et al. |
| 8,244,175 B2 | 8/2012 | Rofougaran |
| 8,244,179 B2 | 8/2012 | Dua |
| 8,279,611 B2 | 10/2012 | Wong et al. |
| 8,339,258 B2 | 12/2012 | Rofougaran |
| 8,346,847 B2 | 1/2013 | Steakley |
| 8,422,482 B2 | 4/2013 | Sugita |
| 8,554,136 B2 | 10/2013 | McCormack |
| 8,634,767 B2 | 1/2014 | Rofougaran et al. |
| 8,755,849 B2 | 6/2014 | Rofougaran et al. |
| 8,794,980 B2 | 8/2014 | McCormack |
| 8,811,526 B2 | 8/2014 | McCormack et al. |
| 8,812,833 B2 | 8/2014 | Liu et al. |
| 8,939,773 B2 | 1/2015 | McCormack |
| 9,374,154 B2 | 6/2016 | Kyles et al. |
| 2002/0008665 A1 | 1/2002 | Takenoshita |
| 2002/0027481 A1 | 3/2002 | Fiedziuszko |
| 2002/0058484 A1 | 5/2002 | Bobier et al. |
| 2002/0097085 A1 | 7/2002 | Stapleton |
| 2002/0106041 A1 | 8/2002 | Chang et al. |
| 2002/0118083 A1 | 8/2002 | Pergande |
| 2002/0140584 A1 | 10/2002 | Maeda et al. |
| 2003/0025626 A1 | 2/2003 | McEwan |
| 2003/0088404 A1 | 5/2003 | Koyanagi |
| 2003/0137371 A1 | 7/2003 | Saitoh et al. |
| 2004/0043734 A1 | 3/2004 | Hashidate |
| 2004/0160294 A1 | 8/2004 | Elco |
| 2004/0214621 A1 | 10/2004 | Ponce De Leon et al. |
| 2005/0032474 A1 | 2/2005 | Gordon |
| 2005/0099242 A1 | 5/2005 | Sano |
| 2005/0109841 A1 | 5/2005 | Ryan et al. |
| 2005/0124307 A1 | 6/2005 | Ammar |
| 2005/0140436 A1 | 6/2005 | Ichitsubo et al. |
| 2005/0259824 A1 | 11/2005 | Isozaki et al. |
| 2006/0003710 A1 | 1/2006 | Nakagawa et al. |
| 2006/0017157 A1 | 1/2006 | Yamamoto et al. |
| 2006/0029229 A1 | 2/2006 | Trifonov et al. |
| 2006/0038168 A1 | 2/2006 | Estes et al. |
| 2006/0051981 A1 | 3/2006 | Neidlein et al. |
| 2006/0077043 A1 | 4/2006 | Amtmann et al. |
| 2006/0082518 A1 | 4/2006 | Ram |
| 2006/0128372 A1 | 6/2006 | Gazzola |
| 2006/0140305 A1 | 6/2006 | Netsell et al. |
| 2006/0159158 A1 | 7/2006 | Moore et al. |
| 2006/0166740 A1 | 7/2006 | Sufuentes |
| 2006/0258289 A1 | 11/2006 | Dua |
| 2006/0276157 A1 | 12/2006 | Chen et al. |

(56) References Cited

U.S. PATENT DOCUMENTS

| | | |
|---|---|---|
| 2007/0010295 A1 | 1/2007 | Greene |
| 2007/0024504 A1 | 2/2007 | Matsunaga |
| 2007/0035917 A1 | 2/2007 | Hotelling et al. |
| 2007/0063056 A1 | 3/2007 | Gaucher et al. |
| 2007/0070814 A1 | 3/2007 | Frodyma et al. |
| 2007/0147425 A1 | 6/2007 | Lamoureux et al. |
| 2007/0229270 A1 | 10/2007 | Rofougaran |
| 2007/0242621 A1 | 10/2007 | Nandagopalan et al. |
| 2007/0273476 A1 | 11/2007 | Yamazaki et al. |
| 2007/0278632 A1 | 12/2007 | Zhao et al. |
| 2008/0002652 A1 | 1/2008 | Gupta et al. |
| 2008/0055093 A1 | 3/2008 | Shkolnikov et al. |
| 2008/0055303 A1 | 3/2008 | Ikeda |
| 2008/0089667 A1 | 4/2008 | Grady et al. |
| 2008/0112101 A1 | 5/2008 | McElwee et al. |
| 2008/0142250 A1 | 6/2008 | Tang |
| 2008/0143435 A1 | 6/2008 | Wilson et al. |
| 2008/0150799 A1 | 6/2008 | Hemmi et al. |
| 2008/0150821 A1 | 6/2008 | Koch et al. |
| 2008/0159243 A1 | 7/2008 | Rofougaran |
| 2008/0165002 A1 | 7/2008 | Tsuji |
| 2008/0165065 A1 | 7/2008 | Hill et al. |
| 2008/0192726 A1 | 8/2008 | Mahesh et al. |
| 2008/0195788 A1 | 8/2008 | Tamir et al. |
| 2008/0197973 A1 | 8/2008 | Enguent |
| 2008/0238632 A1 | 10/2008 | Endo et al. |
| 2008/0289426 A1 | 11/2008 | Kearns et al. |
| 2008/0290959 A1 | 11/2008 | Ali et al. |
| 2008/0293446 A1 | 11/2008 | Rofougaran |
| 2009/0006677 A1 | 1/2009 | Rofougaran |
| 2009/0009337 A1 | 1/2009 | Rofougaran |
| 2009/0015353 A1 | 1/2009 | Rofougaran |
| 2009/0028177 A1 | 1/2009 | Pettus et al. |
| 2009/0029659 A1 | 1/2009 | Gonzalez |
| 2009/0033455 A1 | 2/2009 | Strat et al. |
| 2009/0037628 A1 | 2/2009 | Rofougaran |
| 2009/0073070 A1 | 3/2009 | Rofougaran |
| 2009/0075688 A1 | 3/2009 | Rofougaran |
| 2009/0086844 A1 | 4/2009 | Rofougaran |
| 2009/0091486 A1 | 4/2009 | Wiesbauer et al. |
| 2009/0094247 A1 | 4/2009 | Fredlund et al. |
| 2009/0094506 A1 | 4/2009 | Lakkis |
| 2009/0098826 A1 | 4/2009 | Zack et al. |
| 2009/0110131 A1 | 4/2009 | Bornhoft et al. |
| 2009/0111390 A1 | 4/2009 | Sutton et al. |
| 2009/0175323 A1 | 7/2009 | Chung |
| 2009/0180408 A1 | 7/2009 | Graybeal et al. |
| 2009/0189873 A1 | 7/2009 | Peterson et al. |
| 2009/0218407 A1 | 9/2009 | Rofougaran |
| 2009/0218701 A1 | 9/2009 | Rofougaran |
| 2009/0236701 A1 | 9/2009 | Sun et al. |
| 2009/0237317 A1 | 9/2009 | Rofougaran |
| 2009/0239392 A1 | 9/2009 | Sumitomo et al. |
| 2009/0239483 A1 | 9/2009 | Rofougaran |
| 2009/0245808 A1 | 10/2009 | Rofougaran |
| 2009/0257445 A1 | 10/2009 | Chan et al. |
| 2009/0280765 A1 | 11/2009 | Rofougaran et al. |
| 2009/0282163 A1 | 11/2009 | Washiro |
| 2009/0310649 A1 | 12/2009 | Fisher et al. |
| 2010/0009627 A1 | 1/2010 | Huomo |
| 2010/0063866 A1 | 3/2010 | Kinoshita et al. |
| 2010/0071031 A1 | 3/2010 | Carter et al. |
| 2010/0103045 A1 | 4/2010 | Liu et al. |
| 2010/0120406 A1 | 5/2010 | Banga et al. |
| 2010/0127804 A1 | 5/2010 | Vouloumanos |
| 2010/0149149 A1 | 6/2010 | Lawther |
| 2010/0159829 A1 | 6/2010 | McCormack |
| 2010/0167645 A1 | 7/2010 | Kawashimo |
| 2010/0202345 A1 | 8/2010 | Jing et al. |
| 2010/0202499 A1 | 8/2010 | Lee et al. |
| 2010/0203833 A1 | 8/2010 | Dorsey |
| 2010/0231452 A1 | 9/2010 | Babakhani et al. |
| 2010/0260274 A1 | 10/2010 | Yamada et al. |
| 2010/0265648 A1 | 10/2010 | Hirabayashi |
| 2010/0277394 A1 | 11/2010 | Haustein et al. |
| 2010/0282849 A1 | 11/2010 | Mair |
| 2010/0283700 A1 | 11/2010 | Rajanish et al. |
| 2010/0285634 A1 | 11/2010 | Rofougaran |
| 2010/0289591 A1 | 11/2010 | Garcia |
| 2010/0297954 A1 | 11/2010 | Rofougaran et al. |
| 2010/0315954 A1 | 12/2010 | Singh et al. |
| 2011/0009078 A1 | 1/2011 | Kawamura |
| 2011/0012727 A1 | 1/2011 | Pance et al. |
| 2011/0038282 A1 | 2/2011 | Mihota et al. |
| 2011/0044404 A1 | 2/2011 | Vromans |
| 2011/0047588 A1 | 2/2011 | Takeuchi et al. |
| 2011/0050446 A1 | 3/2011 | Anderson et al. |
| 2011/0084398 A1 | 4/2011 | Pilard et al. |
| 2011/0092212 A1 | 4/2011 | Kubota |
| 2011/0122932 A1 | 5/2011 | Lovberg |
| 2011/0127954 A1 | 6/2011 | Walley et al. |
| 2011/0181484 A1 | 7/2011 | Pettus et al. |
| 2011/0197237 A1 | 8/2011 | Turner |
| 2011/0207425 A1 | 8/2011 | Juntunen et al. |
| 2011/0221582 A1 | 9/2011 | Chuey et al. |
| 2011/0249659 A1 | 10/2011 | Fontaine et al. |
| 2011/0250928 A1 | 10/2011 | Schlub et al. |
| 2011/0285606 A1 | 11/2011 | De Graauw et al. |
| 2011/0286703 A1 | 11/2011 | Kishima et al. |
| 2011/0292972 A1 | 12/2011 | Budianu et al. |
| 2011/0311231 A1 | 12/2011 | Ridgway et al. |
| 2012/0009880 A1 | 1/2012 | Trainin et al. |
| 2012/0013499 A1 | 1/2012 | Hayata |
| 2012/0028582 A1 | 2/2012 | Tandy |
| 2012/0064664 A1 | 3/2012 | Yamazaki et al. |
| 2012/0069772 A1 | 3/2012 | Byrne et al. |
| 2012/0072620 A1 | 3/2012 | Jeong et al. |
| 2012/0082194 A1 | 4/2012 | Tam et al. |
| 2012/0083137 A1 | 4/2012 | Rohrbach et al. |
| 2012/0091799 A1 | 4/2012 | Rofougaran et al. |
| 2012/0110635 A1 | 5/2012 | Harvey et al. |
| 2012/0126794 A1 | 5/2012 | Jensen et al. |
| 2012/0139768 A1 | 6/2012 | Loeda et al. |
| 2012/0219039 A1 | 8/2012 | Feher |
| 2012/0249366 A1 | 10/2012 | Pozgay et al. |
| 2012/0263244 A1 | 10/2012 | Kyles et al. |
| 2012/0265596 A1 | 10/2012 | Mazed et al. |
| 2012/0286049 A1 | 11/2012 | McCormack et al. |
| 2012/0290760 A1 | 11/2012 | McCormack et al. |
| 2012/0295539 A1 | 11/2012 | McCormack et al. |
| 2012/0307932 A1 | 12/2012 | McCormack et al. |
| 2012/0319496 A1 | 12/2012 | McCormack et al. |
| 2012/0319890 A1 | 12/2012 | McCormack et al. |
| 2013/0070817 A1 | 3/2013 | McCormack et al. |
| 2013/0106673 A1 | 5/2013 | McCormack et al. |
| 2013/0109303 A1 | 5/2013 | McCormack et al. |
| 2013/0157477 A1 | 6/2013 | McCormack |
| 2013/0183903 A1 | 7/2013 | McCormack et al. |
| 2013/0196598 A1 | 8/2013 | McCormack et al. |
| 2013/0257670 A1 | 10/2013 | Sovero et al. |
| 2013/0278360 A1 | 10/2013 | Kim et al. |
| 2013/0316653 A1 | 11/2013 | Kyles et al. |
| 2014/0038521 A1 | 2/2014 | McCormack |
| 2014/0043208 A1 | 2/2014 | McCormack et al. |
| 2014/0148193 A1 | 5/2014 | Kogan et al. |
| 2014/0253295 A1 | 9/2014 | Roberts et al. |
| 2014/0266331 A1 | 9/2014 | Arora |
| 2014/0269414 A1 | 9/2014 | Hyde et al. |
| 2015/0111496 A1 | 4/2015 | McCormack et al. |

FOREIGN PATENT DOCUMENTS

| | | |
|---|---|---|
| CN | 1195908 A | 10/1998 |
| CN | 2313296 Y | 4/1999 |
| CN | 1257321 A | 6/2000 |
| CN | 1282450 A | 1/2001 |
| CN | 1389988 A | 1/2003 |
| CN | 1781255 A | 5/2006 |
| CN | 1812254 A | 8/2006 |
| CN | 101090179 A | 12/2007 |
| CN | 101496298 A | 7/2009 |
| CN | 201562854 U | 8/2010 |
| CN | 101908903 A | 12/2010 |
| CN | 102156510 A | 8/2011 |

(56) References Cited

FOREIGN PATENT DOCUMENTS

| | | |
|---|---|---|
| CN | 104937956 A | 9/2015 |
| EP | 0152246 A2 | 8/1985 |
| EP | 0 515 187 A2 | 11/1992 |
| EP | 0789421 A2 | 8/1997 |
| EP | 0884799 A2 | 12/1998 |
| EP | 0896380 A2 | 2/1999 |
| EP | 0996189 A2 | 4/2000 |
| EP | 1041666 A1 | 10/2000 |
| EP | 1 298 809 A2 | 4/2003 |
| EP | 1357395 A1 | 10/2003 |
| EP | 1798867 A2 | 6/2007 |
| EP | 2106192 A2 | 9/2009 |
| EP | 2 309 608 A1 | 4/2011 |
| EP | 2328226 A1 | 6/2011 |
| EP | 2 360 923 A1 | 8/2011 |
| GB | 817349 | 7/1959 |
| GB | 2217114 | 10/1989 |
| JP | 52-72502 A | 6/1977 |
| JP | 5-236031 A | 9/1993 |
| JP | 5-327788 A | 12/1993 |
| JP | 07-006817 A | 1/1995 |
| JP | 9-83538 A | 3/1997 |
| JP | 10-13296 A | 1/1998 |
| JP | H10-065568 A | 3/1998 |
| JP | H11-298343 A | 10/1999 |
| JP | 2000-022665 A | 1/2000 |
| JP | 2001-153963 A | 6/2001 |
| JP | 2001-326506 A | 11/2001 |
| JP | 2002-261514 A | 9/2002 |
| JP | 2002-265729 A | 9/2002 |
| JP | 2003-209511 A | 7/2003 |
| JP | 2004-505505 A | 2/2004 |
| JP | 2005-117153 A | 4/2005 |
| JP | 2008-022247 A | 1/2008 |
| JP | 2008-079241 | 4/2008 |
| JP | 2008-124917 A | 5/2008 |
| JP | 2008-129919 A | 6/2008 |
| JP | 2008-250713 A | 10/2008 |
| JP | 2008 252566 A | 10/2008 |
| JP | 2009-231114 | 7/2009 |
| JP | 2009-239842 A | 10/2009 |
| JP | 2010-509834 A | 3/2010 |
| JP | 2010-183055 A | 8/2010 |
| JP | 2010-531035 A | 9/2010 |
| JP | 2011-022640 A | 2/2011 |
| JP | 2011-41078 A | 2/2011 |
| JP | 2011-044944 A | 3/2011 |
| JP | 2011-176672 A | 9/2011 |
| JP | 2014-516221 | 7/2014 |
| TW | 493369 | 7/2002 |
| TW | 200520434 A | 6/2005 |
| TW | 200810444 A | 2/2008 |
| TW | 200828839 A | 7/2008 |
| TW | 201249293 A1 | 12/2012 |
| WO | WO 97/32413 A | 9/1997 |
| WO | WO 2006/133108 A2 | 12/2006 |
| WO | WO 2009/113373 A1 | 9/2009 |
| WO | WO 2011/114737 A1 | 9/2011 |
| WO | WO 2011/114738 A1 | 9/2011 |
| WO | WO 2012/129426 A3 | 9/2012 |
| WO | WO 2012/154550 A1 | 11/2012 |
| WO | WO 2012/155135 A3 | 11/2012 |
| WO | WO 2012/166922 A1 | 12/2012 |
| WO | WO 2012/174350 A1 | 12/2012 |
| WO | WO 2013/006641 A3 | 1/2013 |
| WO | WO 2013/040396 A1 | 3/2013 |
| WO | WO 2013/059801 A1 | 4/2013 |
| WO | WO 2013/059802 A1 | 4/2013 |
| WO | WO 2013/090625 A1 | 6/2013 |
| WO | WO 2013/130486 A1 | 9/2013 |
| WO | WO 2013/131095 A1 | 9/2013 |
| WO | WO 2013/134444 A1 | 9/2013 |
| WO | WO 2014/026191 A1 | 2/2014 |

OTHER PUBLICATIONS

Bluetooth Headset, Jabra clipper, Jul 28, 2010.
Chinese Office Action, Chinese Application No. 201280025060.8, Oct. 30, 2014, 8 pages (with concise explanation of relevance).
Chinese Second Office Action, Chinese Application No. 201280025060.8, Jun. 11, 2015, 8 pages.
Chinese First Office Action, Chinese Application 201280043190.4, Jan. 21, 2015, 18 pages.
Chinese Second Office Action, Chinese Application No. 201280043190.4, Oct. 26, 2015, 5 pages.
Chinese First Office Action, Chinese Application No. 201280038180.1, Dec. 1, 2015, 16 pages.
Chinese Third Office Action, Chinese Application No. 201280025060.8, Dec. 28, 2015, 6 pages.
Chinese First Office Action, Chinese Application No. 201280062118.6, Jan. 5, 2016, 15 pages.
Chinese First Office Action, Chinese Application No. 201380055859.6, Jan. 20, 2016, 5 pages.
Chinese First Office Action, Chinese Application No. 201380048407.5, Feb. 3, 2016, 14 pages.
Chinese First Office Action, Chinese Application No. 201380023102.9, Jun. 14, 2016, 13 pages (with concise explanation of relevance).
Chinese Fourth Office Action, Chinese Application No. 201280025060.8, Jun. 17, 2016, 5 pages (with concise explanation of relevance).
Chinese Second Office Action, Chinese Application No. 201280038180.1, Aug. 18, 2016, 9 pages (with concise explanation of relevance).
Chinese Second Office Action, Chinese Application No. 201280062118.6, Sep. 6, 2016, 4 pages (with concise explanation of relevance).
Chinese First Office Action, Chinese Application No. 201380071296.X, Sep. 2, 2016, 24 pages (with concise explanation of relevance).
Chinese First Office Action, Chinese Application No. 201480024681.3, Nov. 4, 2016, 6 pages (with concise explanation of relevance).
Chinese Second Office Action, Chinese Application No. 201380048407.5, Nov. 22, 2016, 11 pages (with concise explanation of relevance).
ECMA Standard: "Standard ECMA-398: Close Proximity Electric Induction Wireless Communications," Jun. 1, 2011, pp. 1-100, May be retrieved from the Internet<URL:http://www.ecma-international.org/publications/standards/Ecma-398.htm>.
Enumeration: How the Host Learns about Devices, Jan Axelson's Lakeview Research.
European Examination Report, European Application No. 13711499.7, Oct. 5, 2015, 8 pages.
European Examination Report, European Application No. 13821032.3, Apr. 4, 2016, 3 pages.
European Communication Under Rule 164(2)(a) EPC, European Application No. 14726242.2, Jul. 11, 2016, 3 pages.
European Extended Search Report, European Application No. 13879021.7, Oct. 17, 2016, 6 pages.
Future Technology Devices Interntional Limited (FTDI) "Technical Note TN_I 13 Simplified Description ofUSB Device Enumeration", Doc. Ref. No. FT_000180, Version 1.0, Issue Date Oct. 28, 2009, 19 pages.
Goldstone, L. L. "MM Wave Transmission Polarizer", International Symposium Digest—Antennas & Propagation vol. 2, Jun. 1979, 5 pages.
Ingerski, J. et al., "Mobile Tactile Communications, The Role of the UHF Follow-On Satellite Constellation and Its Successor, Mobile User Objective System," IEEE, 2002, pp. 302-306.
Japanese Office Action, Japanese Patent Office, "Notice of Reasons for Rejection" in connection with related Japanese Patent Application No. 2014-501249, dated Jul. 22, 2014, 7 pages.
Japanese Office Action, Japanese Application No. 2014-513697, Jan. 20, 2015, 7 pages.
Japanese Office Action, Japanese Application No. 2014-519270, Mar. 9, 2015, 17 pages.

(56) References Cited

OTHER PUBLICATIONS

Japanese Office Action, Japanese Application No. 2014-547442, May 25, 2015, 7 pages.
Japanese Office Action, Japanese Application No. 2015-004839, Aug. 10, 2015, 12 pages.
Japanese Office Action, Japanese Application No. 2014-513697, Nov. 2, 2015, 5 pages.
Japanese Office Action, Japanese Application No. 2014/547442, Mar. 14, 2016, 8 pages.
Japanese Office Action, Japanese Application No. 2015-004839, May 16, 2016, 10 pages.
Japanese Office Action, Japanese Application No. 2014-547442, Oct. 24, 2016, 5 pages.
Juntunen, E. A., "60 GHz CMOS Pico-Joule/Bit Oook Receiver Design for Multi-Gigabit Per Second Wireless Communications" thesis paper, Aug. 2008, 52 pages.
Korean Office Action, Korean Application No. 10-2013-7027865, Oct. 22, 2014, 12 pages.
Korean Office Action, Korean Application No. 10-2013-7027865, Apr. 13, 2015, 8 pages.
Korean Office Action, Korean Application No. 10-2015-7029405, Jul. 19, 2016, 4 pages (with concise explanation of relevance).
Li, X. et al., "Space-Time Transmissions for Wireless Secret-Key Agreement with Information-Theoretic Secrecy," IEEE, 2003, pp. 1-5.
Office of Engineering and Technology Federal Communications Commission, "Understanding the FCC Regulations for Low-Power, Non-Licensed Transmitters", OET Bulletin No. 63, Oct. 1993, 34 pages.
PCM510x 2VRMS DirectPath™, 112/106/IOOdB Audio Stereo DAC with 32-bit, 384kHz PCM Interface by Texas Instruments.
PCT International Search Report, PCT Patent Application No. PCT/US2013/027835, dated May 3, 2013, 4 pages.
PCT Written Opinion, PCT Patent Application No. PCT/US2013/027835, May 3, 2013, 8 pages.
PCT International Search Report, PCT Patent Application No. PCT/US2013/029469, Jun. 6, 2013, 5 pages.
PCT Written Opinion, PCT Patent Application No. PCT/US2013/029469, Jun. 6, 2013, 5 pages.
PCT International Search Report, PCT Patent Application No. PCT/US2013/023665, Jun. 20, 2013, 5 pages.
PCT Written Opinion, PCT Patent Application No. PCT/US2013/023665, Jun. 20, 2013, 10 pages.
PCT International Search Report, PCT Patent Application No. PCT/US2012/040214, Aug. 21, 2012, 3 pages.
PCT Written Opinion, PCT Patent Application No. PCT/US2012/040214, Aug. 21, 2012, 8 pages.
PCT International Search Report, PCT Patent Application No. PCT/US2012/042616, Oct. 1, 2012, 4 pages.
PCT Written Opinion, PCT Patent Application No. PCT/US2012/042616, Oct. 1, 2012, 10 pages.
PCT International Search Report, PCT Patent Application No. PCT/US2012/030166, Oct. 31, 2010, 6 pages.
PCT Written Opinion, PCT Patent Application No. PCT/US2012/030166, Oct. 31, 2010, 9 pages.
PCT International Search Report, PCT Patent Application No. PCT/US2012/055488, Dec. 13, 2012, 4 pages.
PCT Written Opinion, PCT Patent Application No. PCT/US2012/055488, Dec. 13, 2012, 8 pages.
PCT International Search Report, PCT Patent Application No. PCT/US2012/045444, Jan. 21, 2013, 7 pages.
PCT Written Opinion, PCT Patent Application No. PCT/US2012/045444, Jan. 21, 2013, 9 pages.
PCT International Search Report, PCT Patent Application No. PCT/US2012/037795, Jan. 21, 2013, 7 pages.
PCT Written Opinion, PCT Patent Application No. PCT/US2012/037795, Jan. 21, 2013, 12 pages.
PCT International Search Report, PCT Patent Application No. PCT/US2012/061345, Jan. 24, 2013, 4 pages.
PCT Written Opinion, PCT Patent Application No. PCT/US2012/061345, Jan. 24, 2013, 7 pages.
PCT International Search Report, PCT Patent Application No. PCT/US2012/061346, Jan. 24, 2013, 5 pages.
PCT Written Opinion, PCT Patent Application No. PCT/US2012/061346, Jan. 24, 2013, 9 pages.
PCT International Search Report, PCT Patent Application No. PCT/US2012/069576, May 2, 2013, 3 pages.
PCT Written Opinion, PCT Patent Application No. PCT/US2012/069576, May 2, 2013, 13 pages.
PCT International Search Report, PCT Patent Application No. PCT/US2013/028896, Sep. 26, 2013, 4 pages.
PCT Written Opinion, PCT Patent Application No. PCT/US2013/028896, Sep. 26, 2013, 4 pages.
PCT International Search Report, PCT Patent Application No. PCT/US2013/046631, Sep. 20, 2013, 4 pages.
PCT Written Opinion, PCT Patent Application No. PCT/US2013/046631, Sep. 20, 2013, 6 pages.
PCT International Search Report, PCT Patent Application No. PCT/US2013/054292, Nov. 29, 2013, 4 pages.
PCT Written Opinion, PCT Patent Application No. PCT/US2013/054292, Nov. 29, 2013, 7 pages.
PCT International Search Report and Written Opinion, PCT Application No. PCT/US2014/024027, Jul. 21, 2014, 15 pages.
PCT International Search Report, PCT Application No. PCT/US2013/075222, Jul. 17, 2014, 4 pages.
PCT Written Opinion, PCT Application No. PCT/US2013/075222, Jul. 17, 2014, 8 pages.
PCT International Search Report, PCT Application No. PCT/US2013/075892, Apr. 23, 2014, 4 pages.
PCT Written Opinion, PCT Application No. PCT/US2013/075892, Apr. 23, 2014, 8 pages.
PCT International Search Report and Written Opinion, PCT Application No. PCT/US2013/033394, Aug. 8, 2013, 10 pages.
PCT International Search Report and Written Opinion, PCT Application No. PCT/US2013/055487, Jan. 24, 2014, 9 pages.
PCT International Search Report and Written Opinion, PCT Application No. PCT/US2013/076687, May 21, 2014, 20 pages.
PCT International Search Report and Written Opinion, PCT Application No. PCT/US2014/030115, Sep. 22, 2014, 15 pages.
PCT International Search Report and Written Opinion, PCT Application No. PCT/US2013/059811, Dec. 2, 2013, 11 pages.
Philips, I2S Bus Specification, Jun. 5, 1996.
RF Power Amplifier, Mar. 22, 2008, 1 page, May be Retrieved at <http://en.wikipedia.org/wiki/RF_power_amplifier>.
Silicon Labs USB-to-12S Audio Bridge Chip Brings Plug-and-Play Simplicity to Audio Design, Cision Wire, Feb. 4, 2013.
Taiwan Office Action, Taiwan Application No. 101110057, Mar. 23, 2016, 7 pages.
Taiwan Office Action, Taiwan Application No. 101147406, Mar. 23, 2016, 6 pages.
Taiwan Office Action, Taiwan Application No. 101119491, May 9, 2016, 9 pages.
Taiwan Office Action, Taiwan Application No. 101138870, Jun. 13, 2016, 8 pages.
Taiwan Office Action, Taiwan Application No. 101121492, Jul. 28, 2016, 11 pages.
Taiwan Office Action, Taiwan Application No. 101124197, Oct. 17, 2016, 8 pages.
TN21065L_I2S, Interfacing 12S-Compatible Audio Devices to the ADSP-21065L Serial Ports, 4/99.
USB in a NutShell . . . (43 pages).
USB Made Simple, MQP Electronics Ltd, 2006-2008 (78 pages).
"Understanding the FCC Regulations for Low-Power Non-Licensed Transmitters", Office of Engineering and Technology, Federal Communications Commission, OET Bulletin No. 63, Oct. 1993.
Universal Serial Bus, Wikipedia, 2012 (32 pages).
Vahle Electrification Systems, "CPS Contactless Power System", Catalog No. 9d/E, 2004, 12 pages.
Wireless HD: "WirelessHD Specification Version 1.1 Overview," May 1, 2010, pp. 1-95, May be retrieved from the Internet<URL:http://www.wirelesshd.org/pdfs/WirelessHD-Specification-Overview-v1.1May2010.pdf>.

(56) References Cited

OTHER PUBLICATIONS

United States Office Action, U.S. Appl. No. 13/485,306, Sep. 26, 2013, 11 pages.
United States Office Action, U.S. Appl. No. 13/541,543, Feb. 12, 2015, 25 pages.
United States Office Action, U.S. Appl. No. 13/541,543, Oct. 28, 2014, 42 pages.
United States Office Action, U.S. Appl. No. 13/427,576, Oct. 30, 2014, 6 pages.
United States Office Action, U.S. Appl. No. 13/524,956, Feb. 9, 2015, 17 pages.
United States Office Action, U.S. Appl. No. 13/524,963, Mar. 17, 2014, 14 pages.
United States Office Action, U.S. Appl. No. 13/657,482, Jan. 2, 2015, 29 pages.
United States Office Action, U.S. Appl. No. 12/655,041, Jun. 7, 2013, 9 pages.
United States Office Action, U.S. Appl. No. 14/047,924, Dec. 19, 2014, 8 pages.
United States Office Action, U.S. Appl. No. 14/047,924, Feb. 27, 2014, 9 pages.
United States Office Action, U.S. Appl. No. 13/784,396, Sep. 11, 2014, 7 pages.
United States Office Action, U.S. Appl. No. 13/760,089, Jul. 7, 2014, 14 pages.
United States Office Action, U.S. Appl. No. 14/596,172, Feb. 10, 2015, 7 pages.
United States Office Action, U.S. Appl. No. 14/462,560, Feb. 13, 2015, 12 pages.
United States Office Action, U.S. Appl. No. 14/026,913, Feb. 25, 2015, 15 pages.
United States Office Action, U.S. Appl. No. 14/135,458, Apr. 13, 2015, 13 pages.
United States Office Action, U.S. Appl. No. 13/541,543, May 28, 2015, 17 pages.
United States Office Action, U.S. Appl. No. 14/047,924, May 21, 2015, 6 pages.
United States Office Action, U.S. Appl. No. 14/026,913, Jun. 5, 2015, 16 pages.
United States Office Action, U.S. Appl. No. 13/922,062, Jul. 23, 2015, 10 pages.
United States Office Action, U.S. Appl. No. 13/963,199, Jul. 27, 2015, 9 pages.
United States Office Action, U.S. Appl. No. 14/109,938, Aug. 14, 2015, 12 pages.
United States Office Action, U.S. Appl. No. 14/026,913, Sep. 18, 2015, 9 pages.
United States Office Action, U.S. Appl. No. 13/657,482, Sep. 22, 2015, 24 pages.
United States Office Action, U.S. Appl. No. 14/215,069, Oct. 30, 2015, 15 pages.
United States Office Action, U.S. Appl. No. 14/047,924, Nov. 18, 2015, 7 pages.
United States Office Action, U.S. Appl. No. 14/881,901, Dec. 17, 2015, 15 pages.
United States Office Action, U.S. Appl. No. 13/541,543, Dec. 21, 2015, 20 pages.
United States Office Action, U.S. Appl. No. 14/936,877, Mar. 23, 2016, 15 pages.
United States Office Action, U.S. Appl. No. 14/106,765, Jun. 9, 2016, 10 pages.
United States Office Action, U.S. Appl. No. 13/963,199, Jun. 1, 2016, 8 pages.
United States Office Action, U.S. Appl. No. 15/144,756, Jun. 16, 2016, 12 pages.
United States Office Action, U.S. Appl. No. 14/047,924, Aug. 11, 2016, 7 pages.
United States Office Action, U.S. Appl. No. 15/204,988, Aug. 31, 2016, 10 pages.
United States Office Action, U.S. Appl. No. 14/936,877, Oct. 4, 2016, 11 pages.
United States Examiner's Answer to Appeal, U.S. Appl. No. 13/541,543, Oct. 7, 2016, 26 pages.
United States Advisory Action, U.S. Appl. No. 14/936,877, Dec. 6, 2016, 6 pages.
Chinese Third Office Action, Chinese Application No. 201280038180.1, Dec. 2, 2016, 9 pages (with concise explanation of relevance).
European Communication About Intention to Grant a European Patent Including Search Results, European Application No. 14726242, Nov. 30, 2016, 9 pages.
United States Office Action, U.S. Appl. No. 14/106,765, Dec. 22, 2016, 13 pages.
Chinese Office Action, Chinese Application No. 201280025060.8, Feb. 14, 2017, 5 pages (with concise explanation of relevance).
Chinese Office Action, Chinese Application No. 201380023102.9, Mar. 1, 2017, 4 pages. (with concise explanation of relevance).
Taiwan Office Action, Taiwan Application No. 102128612, Jan. 10, 2017, 10 pages.
United States Office Action, U.S. Appl. No. 14/047,924, Feb. 27, 2017, 8 pages.

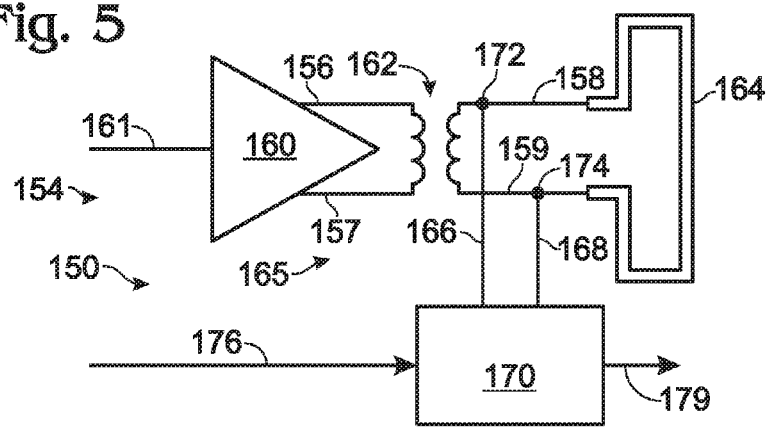
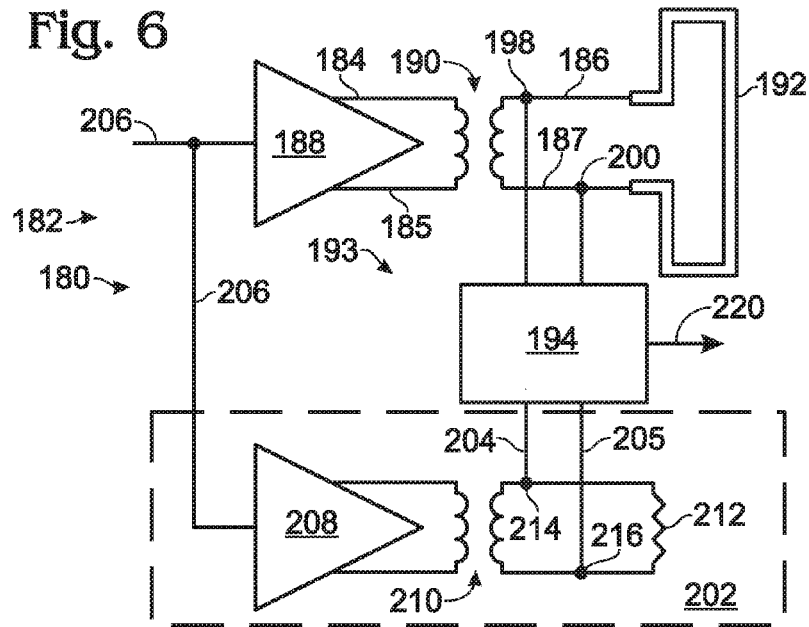
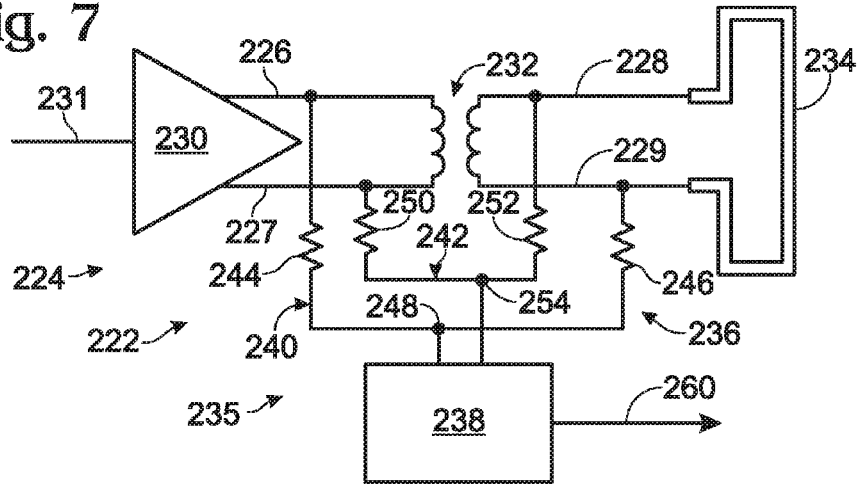

PROXIMITY SENSING USING EHF SIGNALS

CROSS-REFERENCE TO RELATED APPLICATIONS

This application is a continuation of U.S. patent application Ser. No. 14/881,901, filed Oct. 13, 2015, entitled "Proximity Sensing Using EHF Signals," which is a continuation of U.S. patent application Ser. No. 13/524,956, filed Jun. 15, 2012, now U.S. Pat. No. 9,322,904, issued Apr. 26, 2016, and entitled "Proximity Sensing Using EHF Signals," which claims the benefit of U.S. Provisional Patent Application No. 61/497,192, filed Jun. 15, 2011, and entitled "Proximity Sensing and Distance Measurement Using EHF Signals," the contents of each are incorporated by reference herein in their entirety.

FIELD OF THE DISCLOSURE

This disclosure relates to systems and methods for EHF communications, including systems and methods for sensing proximity and determining distance.

BACKGROUND OF THE DISCLOSURE

Advances in semiconductor manufacturing and circuit design technologies have enabled the development and production of integrated circuits (ICs) with increasingly higher operational frequencies. In turn, electronic products and systems incorporating such integrated circuits are able to provide much greater functionality than previous generations of products. This additional functionality has generally included the processing of increasingly larger amounts of data at increasingly higher speeds.

Many electronic systems include multiple printed circuit boards (PCBs) upon which these high-speed ICs are mounted, and through which various signals are routed to and from the ICs. In electronic systems with at least two PCBs and the need to communicate information between those PCBs, a variety of connector and backplane architectures have been developed to facilitate information flow between the boards. Connector and backplane architectures introduce a variety of impedance discontinuities into the signal path, resulting in a degradation of signal quality or integrity. Connecting to boards by conventional means, such as signal-carrying mechanical connectors, generally creates discontinuities, requiring expensive electronics to negotiate. Conventional mechanical connectors may also wear out over time, require precise alignment and manufacturing methods, and are susceptible to mechanical jostling.

SUMMARY OF THE DISCLOSURE

In one example, a system may include a first amplifier for amplifying an output signal having an EHF frequency. A transducer may be operatively coupled to the first amplifier for converting the amplified output signal into an electromagnetic signal having the EHF frequency. A proximity-sensing circuit may be included, responsive to a reference and a composite signal conducted between the first amplifier and the transducer, for sensing the proximity of a transducer field-modifying device proximate to the transducer. The composite signal may include the amplified output signal and any electromagnetic received signal received by the transducer and induced by the field-modifying device.

An illustrative method may include amplifying by a first amplifier an output signal having an EHF frequency. A transducer may convert the amplified output signal into an electromagnetic signal having the EHF frequency. The proximity of a transducer field-modifying device proximate to the transducer may be sensed in response to a reference and a composite signal conducted between the first amplifier and the transducer. The composite signal may include the amplified output signal and any electromagnetic received signal received by the transducer and induced by the field-modifying device.

Advantages of such systems and methods will be more readily understood after considering the drawings and the Detailed Description.

BRIEF DESCRIPTION OF THE DRAWINGS

FIG. 5 is a circuit diagram showing an exemplary proximity-sensing circuit.

FIG. 6 is a circuit diagram showing another exemplary proximity-sensing circuit.

FIG. 7 is a circuit diagram showing another exemplary proximity-sensing circuit.

DETAILED DESCRIPTION OF THE DRAWINGS

Figure 1:
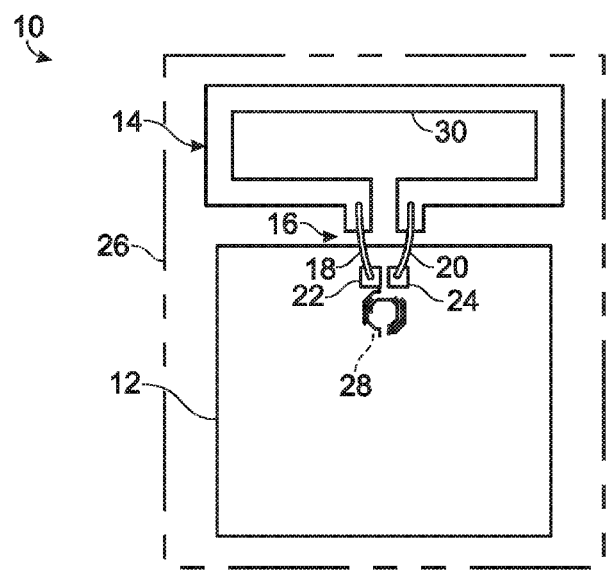
FIG. 1 shows a simplified schematic overhead view of a first example of an integrated circuit (IC) package including a die and antenna.

Wireless communication may be used to provide signal communications between components on a device or may provide communication between devices. Wireless communication provides an interface that is not subject to mechanical and electrical degradation. Examples of systems employing wireless communication between chips are disclosed in U.S. Pat. No. 5,621,913 and U.S. Published Patent Application No. 2010/0159829, the disclosures of which are incorporated herein by reference in their entirety for all purposes.

In one example, tightly-coupled transmitter/receiver pairs may be deployed with a transmitter disposed at a terminal portion of a first conduction path and a receiver disposed at a terminal portion of a second conduction path. The transmitter and receiver may be disposed in close proximity to each other depending on the strength of the transmitted energy, and the first conduction path and the second conduction path may be discontiguous with respect to each other. In some examples, the transmitter and receiver may be disposed on separate circuit carriers positioned with the antennas of the transmitter/receiver pair in close proximity.

As discussed below, in one example a transmitter and/or receiver may be configured as an IC package, in which one or more antennas may be positioned adjacent to a die and held in place by a dielectric or insulating encapsulation or bond material. An antenna may also be held in place by a lead frame substrate. Examples of EHF antennas embedded in IC packages are shown in the drawings and described below. Note that IC packages may also be referred to as EHF IC packages or simply packages, and are examples of wireless communication units that are also variously referred to as EHF communication units, communication units, communication devices, comm-link chip packages, and/or comm-link packages.

FIG. 1 shows an exemplary IC package, generally indicated at 10. IC package 10 includes a chip or die 12, a transducer 14 providing conversion between electrical and electromagnetic (EM) signals, and conductive connectors 16, such as bond wires 18, 20 electrically connecting the transducer to bond pads 22, 24 connected to a transmitter or receiver circuit included in die 12. IC package 10 further includes an encapsulating material 26 formed around at least a portion of the die and/or the transducer. In this example encapsulating material 26 covers die 12, conductive connectors 16, and transducer 14, and is shown in phantom lines so that details of the die and transducer may be illustrated in solid lines.

Die 12 includes any suitable structure configured as a miniaturized circuit on a suitable die substrate, and is functionally equivalent to a component also referred to as a chip or an integrated circuit (IC). A die substrate may be any suitable semiconductor material; for example, a die substrate may be silicon. Die 12 may have a length and a width dimension, each of which may be about 1.0 mm to about 2.0 mm, and preferably about 1.2 mm to about 1.5 mm. Die 12 may be mounted with further electrical conductors 16, such as a lead frame, not shown in FIG. 1, providing connection to external circuits. A transformer 28, shown in dashed lines, may provide impedance matching between a circuit on die 12 and transducer 14.

Transducer 14 may be in the form of a folded dipole or loop antenna 30, may be configured to operate at radio frequencies such as in the EHF spectrum, and may be configured to transmit and/or receive electromagnetic signals. Antenna 30 is separate from but operatively connected to die 12 by suitable conductors 16, and is located adjacent to die 12.

The dimensions of antenna 30 are suitable for operation in the EHF band of the electromagnetic frequency spectrum. In one example, a loop configuration of antenna 30 includes a 0.1 mm band of material, laid out in a loop 1.4 mm long and 0.53 mm wide, with a gap of 0.1 mm at the mouth of the loop, and with the edge of the loop approximately 0.2 mm from the edge of die 12.

Encapsulating material 26 is used to assist in holding the various components of IC package 10 in fixed relative positions. Encapsulating material 26 may be any suitable material configured to provide electrical insulation and physical protection for the electrical and electronic components of IC package 10. For example, encapsulating material 26, also referred to as insulating material, may be a mold compound, glass, plastic, or ceramic. Encapsulating material 26 may also be formed in any suitable shape. For example, encapsulating material 26 may be in the form of a rectangular block, encapsulating all components of IC package 10 except the unconnected ends of conductors 16 connecting the die to external circuits. External connections may be formed with other circuits or components.

Figure 2:
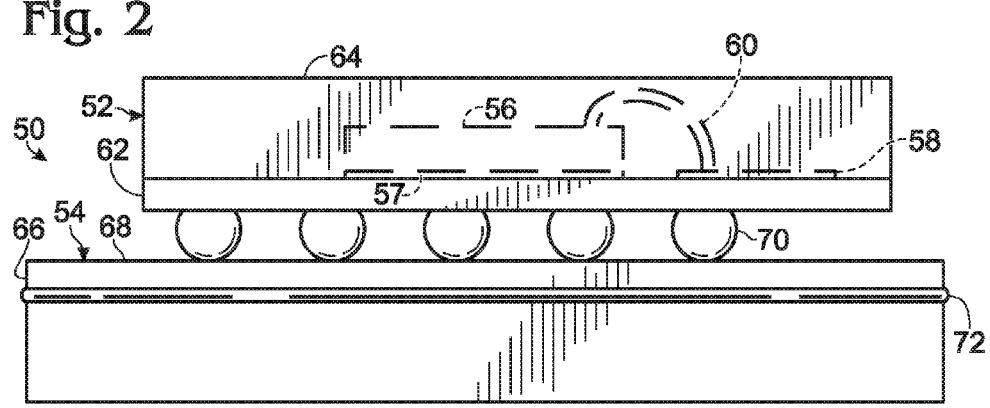
FIG. 2 shows a schematic side view of an exemplary communication device including an IC package and printed circuit board (PCB).

FIG. 2 shows a representational side view of a communication device 50 including an IC package 52 flip-mounted to an exemplary printed circuit board (PCB) 54. In this example, it may be seen that IC package 52 includes a die 56, a ground plane 57, an antenna 58, bond wires, including bond wire 60, connecting the die to the antenna. The die, antenna, and bond wires are mounted on a package substrate 62 and encapsulated in encapsulating material 64. Ground plane 57 may be mounted to a lower surface of die 56, and may be any suitable structure configured to provide an electrical ground for the die. PCB 54 may include a top dielectric layer 66 having a major face or surface 68. IC package 52 is flip-mounted to surface 68 with flip-mounting bumps 70 attached to a metallization pattern (not shown).

PCB 54 may further include a layer 72 spaced from surface 68 made of conductive material forming a ground plane within PCB 54. The PCB ground plane may be any suitable structure configured to provide an electrical ground to circuits and components on PCB 54.

Figure 3:
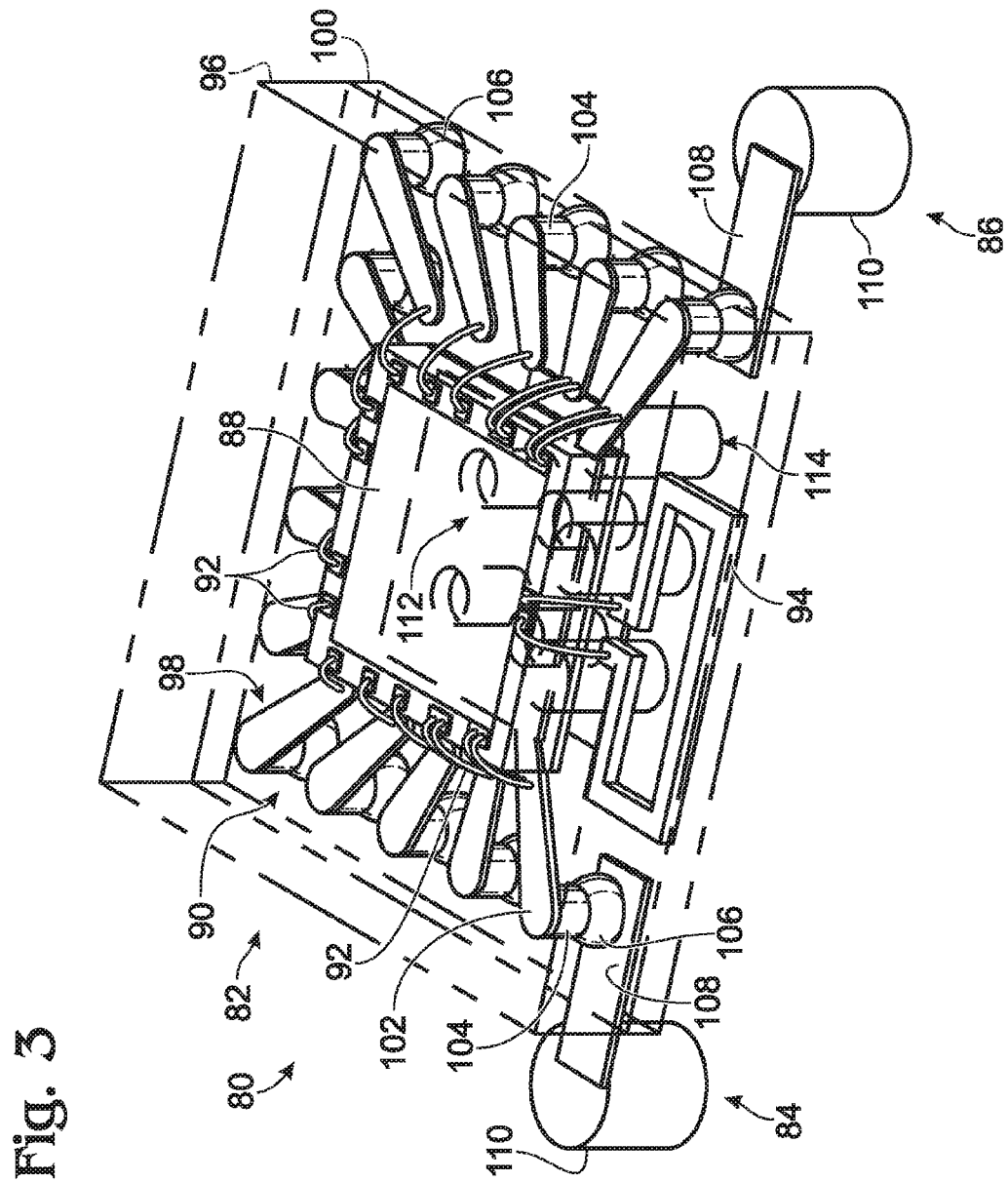
FIG. 3 shows an isometric view of another exemplary communication device including an IC package with external circuit conductors.
Figure 4:
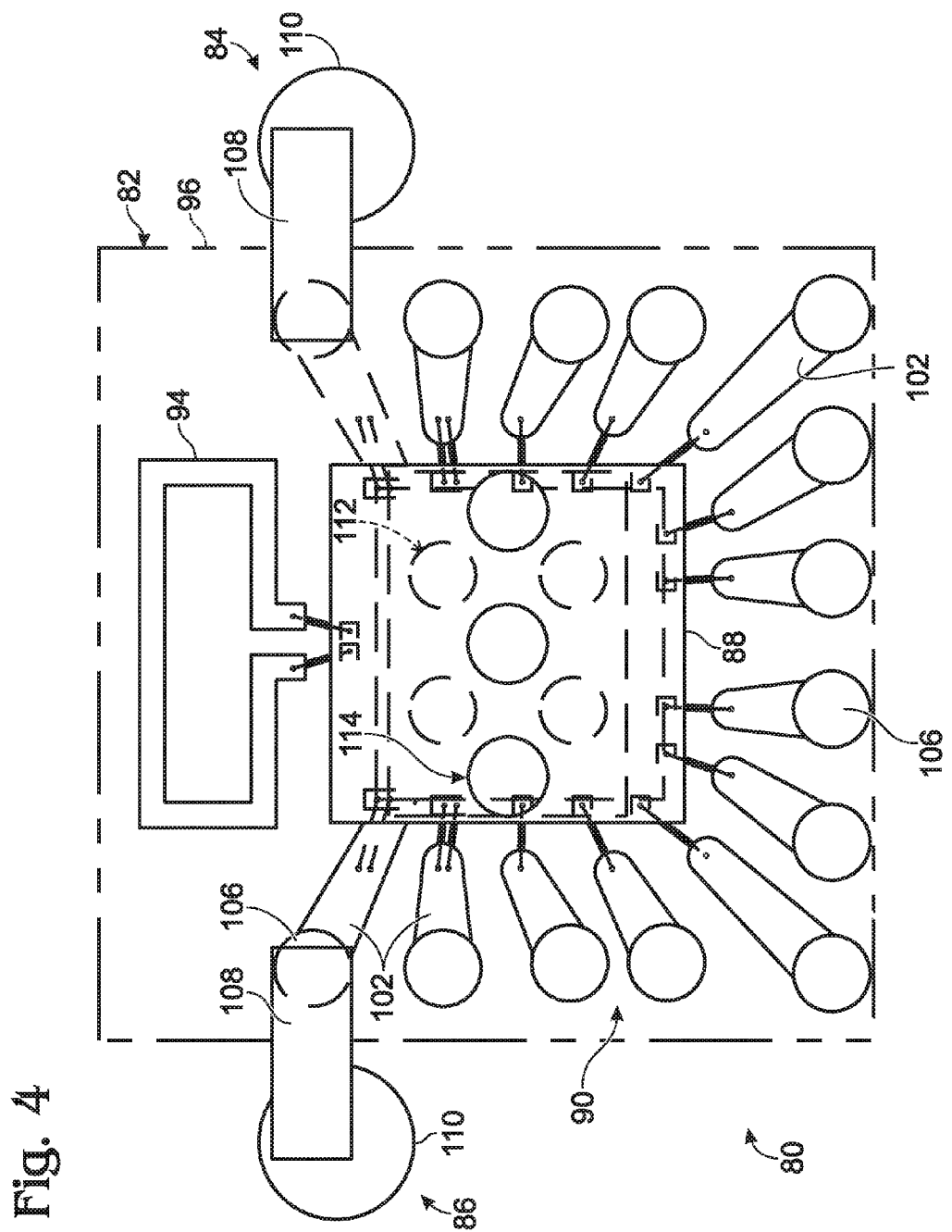
FIG. 4 shows a bottom view of the exemplary communication device of FIG. 3.

FIGS. 3 and 4 illustrate another exemplary communication device 80 including an IC package 82 with external circuit conductors 84 and 86. In this example, IC package 82 may include a die 88, a lead frame 90, conductive connectors 92 in the form of bond wires, an antenna 94, encapsulating material 96, and other components not shown to simplify the illustration. Die 88 may be mounted in electrical communication with lead frame 90, which may be any suitable arrangement of electrical conductors or leads 98 configured to allow one or more other circuits to operatively connect with die 90. Antenna 94 may be constructed as a part of the manufacturing process that produces lead frame 90.

Leads 98 may be embedded or fixed in a lead frame substrate 100, shown in phantom lines, corresponding to package substrate 62. The lead frame substrate may be any suitable insulating material configured to substantially hold leads 98 in a predetermined arrangement. Electrical communication between die 88 and leads 98 of lead frame 90 may be accomplished by any suitable method using conductive connectors 92. As mentioned, conductive connectors 92 may include bond wires that electrically connect terminals on a circuit of die 88 with corresponding lead conductors 98. For example, a conductor or lead 98 may include a plated lead 102 formed on an upper surface of lead frame substrate 100, a via 104 extending through the substrate, a flip-mounting bump 106 mounting IC package 82 to a circuit on a base substrate, such as a PCB, not shown. The circuit on the base substrate may include a external conductors, such as external conductor 84, which for example, may include a strip conductor 108 connecting bump 106 to a further via 110 extending through the base substrate. Other vias 112 may extend through the lead frame substrate 100 and there may be additional vias 114 extending through the base substrate.

In another example, die 88 may be inverted and conductive connectors 92 may include bumps, or die solder balls, as described previously, which may be configured to electrically connect points on a circuit of die 88 directly to corresponding leads 98 in what is commonly known as a "flip chip" arrangement.

A first and a second IC package 10 may be co-located on a single PCB and may provide intra-PCB communication. In other examples, a first IC package 10 may be located on a first PCB and a second IC package 10 may be located on a second PCB and may therefore provide inter-PCB communication.

Regardless of where IC packages 10 are mounted, it remains important to provide improved signal security and integrity when communicating between any two IC packages 10. One method for enhancing or ensuring proper signal security and integrity is to verify a second IC package is within a predetermined range before or during a communication attempt. To that end, systems and methods for detecting the presence of a second IC package and/or for ensuring another device or surface is within a certain distance will now be described FIG. 5 is a circuit diagram showing an illustrative communication system or circuit generally indicated at 150. In this example, communication circuit 150 may be at least partially included in the die of an IC package 154 and may be configured as a transmitter, similar to IC package 10. Communication circuit 150 may also include a power amplifier 160, a transformer 162, a transducer in the form of an antenna 164, and a proximity-sensing circuit 165. Signal conductors 156 and 157 connect the power amplifier to the transformer, and signal conductors 158 and 159 connect the transformer to the antenna. Proximity-sensing circuit 165 may include a detection circuit 170 and sensing conductors 166 and 168 electrically connecting conductors 158 and 159, respectively, to the detection circuit.

In the example shown in FIG. 5, proximity of a nearby object (not shown) may be detected by a change in the effective impedance of antenna 164 caused by the nearby object. In this sense, the object may be considered a transducer field-modifying device. A change in the effective impedance of the antenna may produce a change in a composite signal appearing on signal conductors 158 and 159.

Power amplifier 160 may be any suitable circuit configured to amplify an RF signal received on an input conductor 161 for transmission by antenna 164. After amplification, signal conductors 156 and 157 may carry the RF signal through the primary winding of transformer 162. Signal conductors 158 and 159 may then carry the transformed RF signal to antenna 164. Transformer 162 may be any suitable transformer configured to accomplish impedance matching for improved RF signal strength at the antenna.

Continuing with the example depicted in FIG. 5, detection circuit 170 may be connected via signal conductors 166 and 168 to signal conductors 158 and 159 at nodes 172 and 174, respectively. Detection circuit 170 may detect a characteristic of a composite signal existing on signal conductors 158 and 159, such as an amplitude of voltage of the composite RF signal. The composite signal may include the amplified and transformed RF output signal as well as any received signal received by antenna 164. The detector circuit may thus detect any difference between the composite signal and the amplified RF signal that exists when the nearby object is in a reference position. For example, a reference position may be at a predefined distance from the antenna where the nearby object produces an expected effect on the antenna, and the predefined distance may be a distance sufficient for the nearby object to not produce a predefined effect on the composite signal.

An amplitude reference level may be provided on a reference conductor 176 to detection circuit 170. In this example, detection circuit 170 compares the amplitude of the composite signal occurring at nodes 172 and 174 to the provided reference level on reference conductor 176. Based on this comparison, a difference between the detected and the reference levels may indicate that an impedance of antenna 164 is different than expected. The amount of difference may be proportional to a reflected signal from a nearby object such as a second IC package or device. Based on the amplitude of the impedance change, a signal may then be generated and output on an indicator conductor 179 indicating the presence or absence of a nearby object. In some examples, this may indicate the presence or absence of a receiving IC package (not shown) suitable for receiving transmissions from IC package 154.

FIG. 6 shows another example of a communication system or circuit generally indicated at 180. In this example, communication circuit 180 may be at least partially included in the die of an IC package 182 and may be configured as a transmitter, similar to IC packages 10 and 154 previously described. As in the example of FIG. 5, communication circuit 180 may also include a power amplifier 188, a transformer 190, a transducer in the form of an antenna 192, and a proximity-sensing circuit 193. Signal conductors 184 and 185 connect the power amplifier to the transformer, and signal conductors 186 and 187 connect the transformer to the antenna. Furthermore, proximity-sensing circuit 193 may include a detection circuit 194 similar to circuit 170. As in the previous example, detection circuit 194 detects an amplitude of voltage at nodes 198 and 200. However, instead of separately providing a reference value such as the reference level on reference conductor 176, a reference level may be detectable by detection circuit 194 on a second circuit such as reference circuit 202 via conductors 204 and 205.

Reference circuit 202 may be a replica of a portion of communication circuit 180. More specifically, reference circuit 202 may receive an RF signal that is also input to amplifier 188 on an input conductor 206. Reference circuit 202 may include a replica power amplifier 208 substantially identical to power amplifier 188, a replica transformer 210 substantially identical to transformer 190, and an antenna equivalent 212 having an impedance that is substantially equal to that of antenna 192 when the nearby object is in the reference position. Antenna equivalent 212 may include terminals 214 and 216 that are disposed between transformer 210 and impedance 212, as shown in FIG. 6.

Accordingly, reference circuit 202 may be configured to have the same input and substantially equivalent components as a corresponding portion of communication circuit 180. Detection circuit 194 may therefore be configured to detect a reference amplitude of a voltage at terminals 214 and 216, and communicate the reference amplitude as the reference level to detection circuit 194 via conductors 204 and 205. That reference level may then be compared to the voltage detected at nodes 198 and 200, and any difference may be proportional to an impedance change caused by the presence of a nearby object such as a second, receiving IC package (not shown). Based on a predetermined threshold or range of values, detection circuit 194 may then generate a signal on an indicator conductor 220 indicating the presence or absence of a nearby object. In some examples, this may indicate presence or absence of a receiving IC package (not shown) suitable for receiving transmissions from IC package 182.

Figure 8:
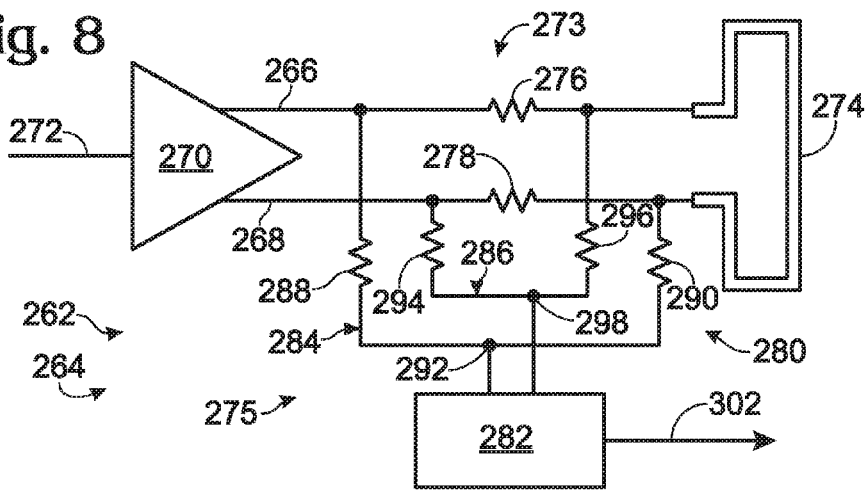
FIG. 8 is a circuit diagram showing another exemplary proximity-sensing circuit.

Turning to FIGS. 7 and 8, two further examples of proximity-sensing circuits are depicted. In each of these examples, a cancellation network may be configured using two resistive voltage dividers to cancel the transmitted signal portion of a detected signal, allowing any deviation from the expected transmitted signal to be detected as a change from zero.

FIG. 7 shows an illustrative communication circuit generally indicated at 222. In this example, communication circuit 222 may be at least partially located on the die of an IC package 224 configured as a transmitter, similar to IC packages 10, 154, and 182 previously described. As in previous examples, communication circuit 222 may include a power amplifier 230 for amplifying an RF signal received on an input conductor 231, a transformer 232, a transducer in the form of an antenna 234, and a proximity-sensing circuit 235. Amplifier 230 may be connected to the primary winding of transformer 232 by conductors 226 and 227, and the secondary windings of the transformer may be connected to antenna 234 by conductors 228 and 229. Rather than a detection circuit, proximity-sensing circuit 235 includes a cancellation network 236 connected to signal conductors 226, 227, 228, and 229 across transformer 232, and an amplitude detection circuit 238 connected to cancellation network 236.

Cancellation network 236 may include resistive voltage dividers 240 and 242, each connected across transformer 232. Resistive voltage divider 240 may include a first resistor 244 connected in series with a second resistor 246, with a node 248 between the two resistors. Similarly, resistive voltage divider 242 may include a first resistor 250 connected in series with a second resistor 252, with a node 254 between the two resistors.

Resistive voltage dividers 240 and 242 of cancellation network 236 may be configured such that a transmitted signal may be effectively cancelled by the network when measured at nodes 248 and 254. For example, resistance values of resistors 244, 246, 250, and 252 may be chosen with respect to the coupling factor of transformer 232 such that a voltage 258 measured across nodes 248 and 254 is effectively zero when impedance of antenna 234 is at its expected value. This may be achieved by setting the ratio of the value of the second resistor to the sum of the value of the first and second resistors to approximate the coupling factor.

In other words, in the example of FIG. 7 (and of FIG. 8), the expected voltage across the nodes of the voltage dividers is effectively zero when antenna impedance is at an expected value corresponding to when the nearby object is in the reference position. Accordingly, any amplitude indicates variance from that value and therefore reflection of energy into the antenna. Reflection of this sort, in turn, indicates the presence of a second, nearby object or surface (not shown). Comparing the detected voltage to a predetermined value or range of values, a signal may be generated corresponding to either the presence or absence of an object or surface.

Accordingly, amplitude detection circuit 238 may be any suitable circuit configured to detect the voltage across nodes 248 and 254, and to generate an signal on an indicator conductor 260 responsive to the voltage detected. For example, signal 260 may indicate the presence of a nearby object (not shown) in response to a non-zero value of the detected voltage.

Turning now to FIG. 8, another illustrative communication circuit generally indicated at 262 is depicted. As in the previous example, communication circuit 262 may be at least partially located on the die of an IC package 264 configured as a transmitter. As in previous examples, communication circuit 262 may include a power amplifier 270 for amplifying an RF signal received on an input conductor 272, a transducer in the form of an antenna 274, and a proximity-sensing circuit 275. Rather than a transformer, however, communication circuit 262 may include an impedance circuit 273, which may include series resistors, such as series resistors 276 and 278 disposed in signal conductors 266 and 268, respectively, coupling the amplifier to the transducer.

As in the previous example, proximity-sensing circuit 275 includes a cancellation network 280 connected to signal conductors 266 and 268 across series resistors 276 and 278, and an amplitude detection circuit 282 connected to cancellation network 280. As before, cancellation network 280 may include resistive voltage dividers 284 and 286. Resistive voltage divider 284 may include a first resistor 288 connected in series with a second resistor 290, with a node 292 in between, and resistive voltage divider 286 may include a first resistor 294 connected in series with a second resistor 296, with a node 298 in between. In this example, resistive voltage dividers 284 and 286 may be configured as described above, but with resistance values chosen with respect to both antenna impedance and the resistance of resistors 276 and 278 to cause a measured voltage across nodes 292 and 298 to be zero if the expected antenna impedance exists. This may be achieved by setting the ratio of the value of the second resistor to the sum of the value of the first and second resistors to approximate the ratio of the antenna impedance to the sum of the antenna impedance and the resistance of a series resistor.

As before, amplitude detection circuit 282 may be any suitable circuit configured to measure voltage across nodes 292 and 298, and to generate a signal on an indicator conductor 302 that is responsive to the voltage detected. For example, the signal may indicate the presence of a nearby object (not shown) in response to a nonzero value of the voltage at nodes 292 and 298.

Figure 9:
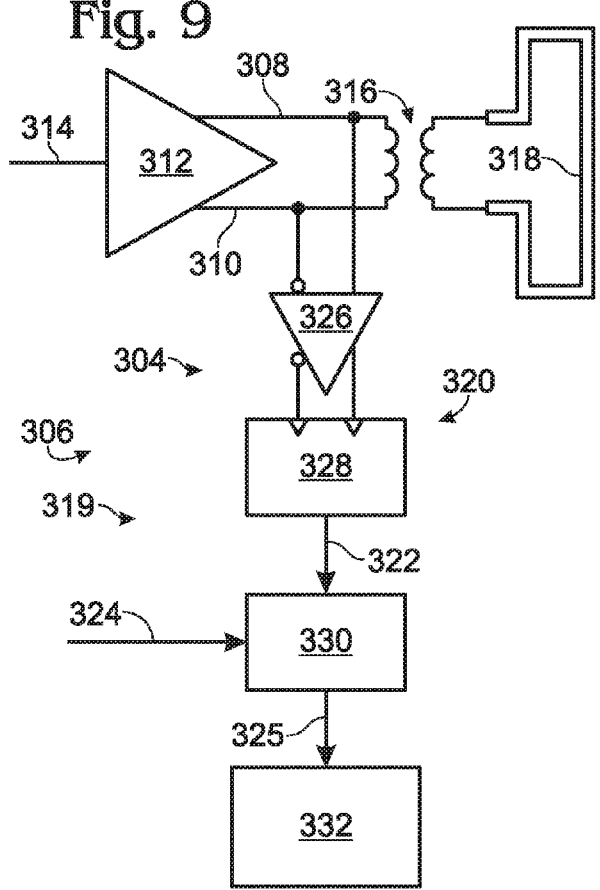
FIG. 9 is a circuit diagram showing another exemplary proximity-sensing circuit.

FIG. 9 shows another illustrative communication circuit generally indicated at 304. In this example, communication circuit 304 may be at least partially located on the die of an IC package 306 configured as a transmitter, similar to IC packages previously described. As in previous examples, communication circuit 304 may include a power amplifier 312 for amplifying an RF signal received on an input conductor 314, a transformer 316, a transducer in the form of an antenna 318, and a proximity-sensing circuit 319. A frequency detection circuit 320 may be connected to signal conductors 308 and 310 extending between power amplifier 312 and transformer 316.

Frequency detection circuit 320 may be any suitable circuit configured to sense a frequency of the signal being carried on signal conductors 308 and 310, and to compare that sensed frequency to a reference value input on a reference conductor 324. The reference value is representative of a frequency that would exist when the nearby object is in the reference position. The detection circuit generates a proximity indication signal on an indication conductor 325 in response to a result of the comparison. The presence of a nearby object (not shown) sufficiently close to the antenna causes the frequency of the composite signal appearing on conductors 308 and 310 to vary based on the presence and proximity of the nearby object.

In the example depicted in FIG. 9, frequency detection circuit 320 may include an isolation amplifier 326 connected to signal conductors 308 and 310, providing output to a divider circuit 328, which in turn may divide the signal to a more usable level and provide a sensed signal on a conductor 322 to a dual counter circuit 330. Dual counter circuit 330 also receives the input reference signal on conductor 324 corresponding to the expected frequency value of the sensed signal when the nearby object is in the reference position. The proximity indication signal may be provided by the dual counter circuit to a controller 332 on conductor 325.

Now turning from proximity sensing to distance measurement, illustrative circuits using communication circuits formed in IC packages 10 are described which may be used to ensure two surfaces are at a desired spacing or within a desired spacing range, or to determine the actual or relative distance between two surfaces. For example, it may be desirable for a first device to detect that a second device is close enough for secure or unimpaired communications before the devices communicate. Combinations of IC packages 10 or other communication circuits may be utilized to perform this function.

Figure 10:
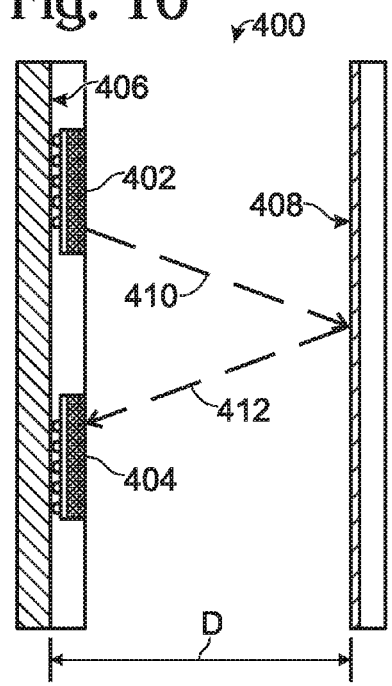
FIG. 10 shows an exemplary distance measuring system having two communications units and a field-modifying device.
Figure 11:
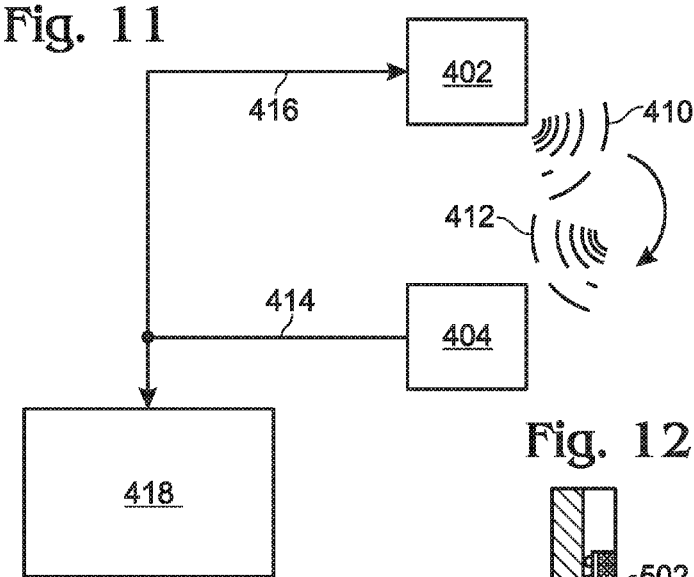
FIG. 11 is a block diagram of a variation of the system of FIG. 10.

FIGS. 10 and 11 show examples of distance detecting systems in which reflected EHF signals may be used to determine a distance to a reflective surface. In FIG. 10, reflective measuring system 400 may include two IC packages 402 and 404 mounted near each other on a first surface 406 facing a second surface 408. Second surface 408 may be reflective with respect to RF energy, and may have, for example, an electrically conductive surface. IC package 402 may be configured as a transmitter, with IC package 404 configured as a receiver. A transmitted EHF signal 410 transmitted by IC package 402 may be reflected by second surface 408 before being received as a reflected EHF signal 412 by IC package 404.

The circuitry may then analyze a relationship between the respective signals experienced by IC packages 402 and 404, calculating an actual or relative distance between first surface 406 and second surface 408, or determining an indicator signal representative of the distance between the surfaces. For example, a round-trip time of propagation of a signal that is transmitted and reflected may be calculated, which time of propagation is proportional to a distance D between the surfaces.

In a related example, shown in the block diagram of FIG. 11, an output 414 of receiver IC package 404 may be fed into an input 416 of transmitter IC package 402. One of either IC package 402 or 404 may also be configured to invert the signal, such that a frequency of that inversion may be measured by a measuring circuit 418, including a frequency counter, that is in communication with the input 416 of IC package 402. This frequency is proportional to a propagation delay in the system. Because signal propagation time through the distance D between surfaces increases as the distance is widened, frequency and propagation delay has a relationship to the distance D between surfaces 406 and 408, and a distance D is calculated based on the measured frequency. Accordingly, the examples of FIGS. 10 and 11 show that distance may be measured using a reflective measuring system 400. Accordingly, measuring circuit 418 may generate an indicator signal representative of the distance D.

Figure 12:
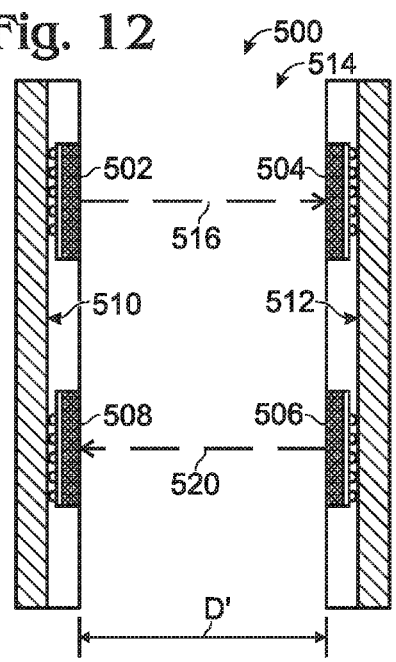
FIG. 12 shows another exemplary distance measuring system having four communications units.
Figure 13:
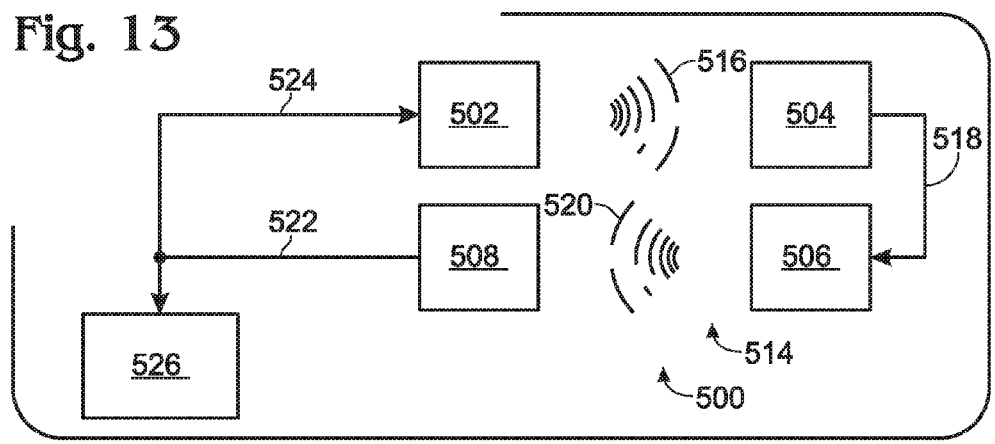
FIG. 13 is a block diagram of the system of FIG. 12.

In a similar arrangement, FIGS. 12 and 13 show another illustrative distance measuring system generally indicated at 500, having four IC packages 502, 504, 506, 508 arranged on two surfaces 510 and 512 to form a ring oscillator 514. Ring oscillator 514 may be configured such that IC package 502 on surface 510 transmits an electromagnetic (EM) EHF signal 516 that is received by IC package 504 on surface 512. IC package 504 may be in electrical communication with IC package 506, also located on surface 512. Accordingly, EM signal 516 may be converted to signal 518 and directly fed into an input of IC package 506. IC package 506, in turn, may be configured to transmit signal 518 as an EM EHF signal 520 to IC package 508 located on surface 510.

A delay in propagation time of the signal corresponding to signals 516, 518, and 520 is proportional to the variable distance D' between surfaces 510 and 512. Furthermore, an output 522 of IC package 508 may be fed directly into an input 524 of IC package 502, and an odd number (i.e., one or three) of the IC packages may be wired as inverters. Because an odd number of the packages are thus wired to invert the signal, input signal 524 measured at IC package 502 would be inverted at a rate proportional to the overall propagation delay in ring oscillator 514. In other words, the signal may have its sign reversed each time it makes a round trip, and therefore it would reverse at a frequency proportional to how long that round trip takes. Accordingly, a measuring circuit 526, such as one including a frequency counter, may measure the frequency of reversal or oscillation and calculate a distance between surfaces 510 and 512 based on that measurement.

Figure 14:
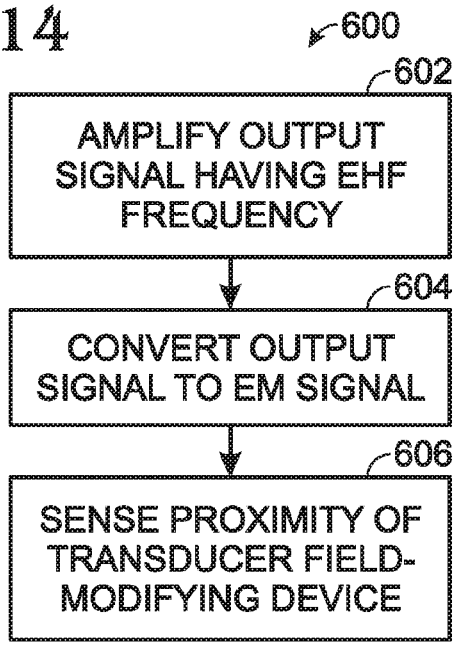
FIG. 14 is a flow chart showing an exemplary proximity-sensing method.

FIG. 14 shows an illustrative method 600 for determining proximity of a nearby object, as variously provided by circuits and systems previously described. Step 602 may include amplifying an RF output signal having an EHF frequency. Step 604 may include converting the amplified signal from step 602 into an electromagnetic signal. For example, a transducer such as an antenna may be used to convert the signal to an EM signal. A nearby object may affect the field of the transducer, either directly or indirectly. Step 606 may include sensing the proximity of that transducer field-modifying device or object.

Figure 15:
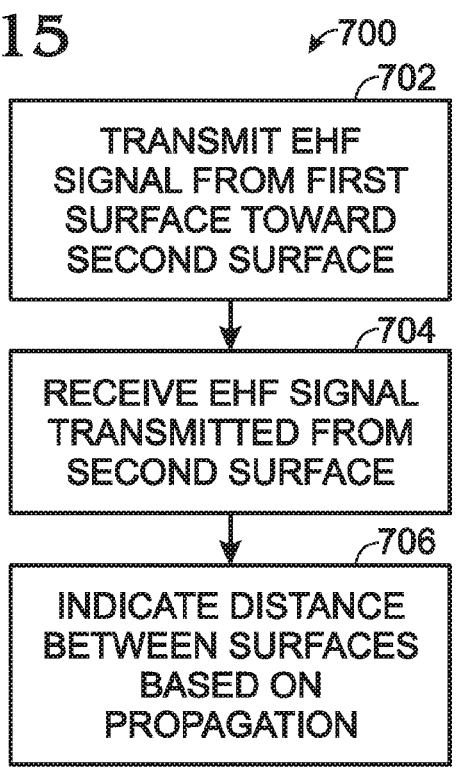
FIG. 15 is a flow chart showing an exemplary distance-measuring method.

FIG. 15 shows an illustrative method 700 for determining a distance between two surfaces, as variously provided by circuits and systems previously described. Step 702 may include transmitting an EHF signal from a first surface toward a second surface. The second surface may reflect the EHF signal, or may receive the EHF signal and retransmit a version of the signal in response. Step 704 may include receiving whatever signal is transmitted from the second surface, to include a reflected signal. Step 706 may include determining and indicating distance between the two surfaces based on a characteristic of the propagation of the signal between the two surfaces.

Accordingly, a system or method as described above for proximity sensing and distance measurement using EHF signals may include one or more of the following examples.

In one example, a system may include a first amplifier for amplifying an output signal having an EHF frequency. A transducer may be operatively coupled to the first amplifier for converting the amplified output signal into an electromagnetic signal having the EHF frequency. A proximity-sensing circuit may be included, responsive to a reference and a composite signal conducted between the first amplifier and the transducer, for sensing the proximity of a transducer field-modifying device proximate to the transducer. The composite signal may include the amplified output signal and any electromagnetic received signal received by the transducer and induced by the field-modifying device.

The reference may be representative of a characteristic of the composite signal when the transducer field-modifying device is in a reference position. The proximity-sensing circuit may generate an indicator signal indicative of a change in the composite signal. More specifically, the reference may be a reference signal representative of the amplified output signal when the transducer field-modifying device is in a reference position. The proximity-sensing circuit may generate an indicator signal indicative of a composite signal including a received signal received by the transducer. The proximity-sensing circuit may compare an amplitude of the reference signal with an amplitude of the composite signal. The proximity-sensing circuit may include a reference circuit having a second amplifier and a terminating impedance coupled to an output of the amplifier, with the terminating impedance being substantially equivalent to an impedance of the transducer when the transducer field-modifying device is in the reference position. The reference circuit may generate the reference signal between the second amplifier and the terminating impedance.

The reference may instead be representative of a frequency of the amplified output signal when the transducer field-modifying device is in a reference position. The proximity-sensing circuit may detect the frequency of the composite signal and produce the indicator signal indicative of when there is a change in the frequency of the composite signal. Furthermore, the reference signal may be a clock signal representative of the frequency of the amplified output signal when the transducer field-modifying device is in the reference position. The proximity-sensing circuit may include a dual counter responsive to a frequency signal representative of the frequency of the composite signal and the reference signal. The proximity-sensing circuit may produce the indicator signal indicative of a change in the frequency of the composite signal relative to the frequency of the amplified output signal when the transducer field-modifying device is in the reference position.

The proximity-sensing circuit may include a cancellation circuit that cancels the amplified output signal from the composite signal. The system may further include an impedance circuit coupling the first amplifier with the transducer. The cancellation circuit may have first and second resistive voltage dividers connected in parallel with the impedance circuit. The resistive voltage dividers may produce relative voltages that effectively cancel an amplified output signal but do not cancel the received signal. The received signal may be detected on the resistive voltage dividers. The impedance circuit may include a transformer having a coupling factor, and the voltage dividers may include a first resistor connected to a first conductor coupling the first amplifier to the transformer and a second resistor connected to a second conductor coupling the transformer to the transducer, the ratio of a resistance of the second resistor to the sum of resistances of the first and second resistors is proportional to the coupling factor of the transformer. Alternatively, the impedance circuit may include an in-line resistor and the voltage dividers may include a first resistor connected between the in-line resistor and the first amplifier and a second resistor connected between the in-line resistor and the transducer, and the ratio of a resistance of the second resistor to the sum of resistances of the first and second resistors is proportional to the ratio of an impedance of the transducer to the sum of impedances of the transducer and the in-line resistor.

In another example, a system may include a first transmit communication unit mounted on a first surface for transmitting a receive EHF signal toward a second surface spaced from the first surface. A first receive communication unit may be mounted on the first surface adjacent the first transmit communication unit for receiving a receive EHF signal transmitted from the second surface. A detecting circuit coupled to the first transmit communication unit and the first receive communication unit may determine an indicator representative of a distance between the first and second surfaces based on the propagation of the transmit and receive EHF signals between the first transmit communication unit and the first receive communication unit.

The detecting circuit may determine from signals representative of the transmit and receive EHF signals, a time representative of the time of propagation of the transmit and receive EHF signals between the first transmit communication unit and the first receive communication unit.

The transmit EHF signal may reflect off of the second surface and propagate as the receive EHF signal toward the first receive communication unit.

The transmit and receive EHF signals may be modulated and the detecting circuit may be responsive to a modulation signal input to the first transmit communication unit and a demodulation signal output from the first transmit communication unit.

The system may further include a second transmit communication unit and a second receive communication unit mounted on the second surface. The first transmit communication unit may transmit the transmit EHF signal to the second receive communication unit. The second receive communication unit may be coupled to the second transmit communication unit and may communicate a communication signal representative of the transmit EHF signal received by the second receive communication unit to the second transmit communication unit. The second transmit communication unit may transmit to the first receive communication unit the receive EHF signal representative of the communication signal. The first receive communication unit may be coupled to the first transmit communication unit, with the first and second transmit communication units and first and second receive communication units forming in combination a ring oscillator. The detecting circuit may determine an oscillation period of the ring oscillator, the oscillation period being related to a distance between the first surface and the second surface. The transmit and receive EHF signals may instead be modulated, and the detecting circuit may be responsive to a modulation signal input to the first transmit communication unit and a demodulation signal output from the first transmit communication unit.

An illustrative method may include amplifying by a first amplifier an output signal having an EHF frequency. A transducer may convert the amplified output signal into an electromagnetic signal having the EHF frequency. The proximity of a transducer field-modifying device proximate to the transducer may be sensed in response to a reference and a composite signal conducted between the first amplifier and the transducer. The composite signal may include the amplified output signal and any electromagnetic received signal received by the transducer and induced by the field-modifying device.

The reference may be representative of a characteristic of the composite signal when the transducer field-modifying device is in a reference position, an indicator signal may be generated indicative of a change in the composite signal. The reference may be a reference signal representative of the amplified output signal when the transducer field-modifying device is in a reference position, and generating an indicator signal may include generating an indicator signal indicative of a composite signal including a received signal received by the transducer. An amplitude of the reference signal may be compared with an amplitude of the composite signal. The output signal may be amplified by a second amplifier, outputting as the reference signal the output signal amplified by the second amplifier to a terminating impedance that is substantially equivalent to an impedance of the transducer when the transducer field-modifying device is in the reference position. The reference may instead be representative of a frequency of the amplified output signal when the transducer field-modifying device is in a reference position. Generating an indicator signal may include detecting a frequency of the composite signal and producing the indicator signal indicative of when there is a change in the frequency of the composite signal. The reference signal may be produced as a clock signal representative of the frequency of the amplified output signal when the transducer field-modifying device is in the reference position. Detecting a frequency of the composite signal may include counting the cycles of the composite signal and producing the indicator signal indicative of a change in the frequency of the composite signal relative to the frequency of the amplified output signal when the transducer field-modifying device is in the reference position.

A signal may be produced representative of a received signal by canceling the amplified output signal from the composite signal. Canceling the amplified output signal from the composite signal may include applying a voltage divider across an impedance circuit coupling the first amplifier with the transducer. The resistive voltage dividers may produce relative voltages that effectively cancel the amplified output signal but do not cancel the received signal. Producing a signal representative of a received signal may include detecting the received signal on the resistive voltage dividers. The impedance circuit may include a transformer having a coupling factor. Applying a voltage divider may include connecting a first resistor to a first conductor coupling the first amplifier to the transformer and connecting a second resistor to a second conductor coupling the transformer to the transducer, with the ratio of a resistance of the second resistor to the sum of resistances of the first and second resistors being proportional to the coupling factor of the transformer. The impedance circuit may instead include an inline resistor. Applying a voltage divider may include connecting a first resistor between the in-line resistor and the first amplifier and connecting a second resistor between the in-line resistor and the transducer, with the ratio of a resistance of the second resistor to the sum of resistances of the first and second resistors being proportional to the ratio of an impedance of the transducer to the sum of impedances of the transducer and the inline resistor.

Another illustrative method may include transmitting by a first transmit communication unit mounted on a first surface, a transmit EHF signal toward a second surface. A first receive communication unit mounted on the first surface adjacent the first transmit communication unit may receive a receive EHF signal transmitted from the second surface. A detecting circuit coupled to the first transmit communication unit and the first receive communication unit may generate an indicator representative of a distance between the first and second surfaces based on the propagation of the transmit and receive EHF signals between the first transmit communication unit and the first receive communication unit.

Generating an indicator may include determining from signals representative of the transmit and receive EHF signals, a time representative of the time of propagation of the transmit and receive EHF signals between the first transmit communication unit and the first receive communication unit.

The transmit EHF signal may be reflected off of the second surface and propagated as the receive EHF signal toward the first receive communication unit.

A modulation signal may be input into the first transmit communication unit, modulating by the first transmit communication unit the transmit EHF signal, demodulating by the first receive communication unit the receive EHF signal, and outputting a demodulation signal from the first receive communication unit. Generating the indicator may include generating the indicator in response to the modulation signal and the demodulation signal.

The transmit EHF signal may be transmitted to a second receive communication unit mounted on the second surface. A communication signal representative of the transmit EHF signal received by the second receive communication unit may be communicated to a second transmit communication unit mounted on the second surface. The receive EHF signal representative of the communication signal may be transmitted by the second transmit communication unit to the first receive communication unit. The first receive communication unit may be coupled to the first transmit communication unit so that the first and second transmit communication units and the first and second receive communication units form in combination a ring oscillator. Generating an indicator may include determining an oscillation period of the ring oscillator, the oscillation period being related to a distance between the first surface and the second surface. A modulation signal may instead be input into the first transmit communication unit, modulating by the first transmit communication unit the transmit EHF signal, demodulating by the first receive communication unit the receive EHF signal, and outputting a demodulation signal from the first receive communication unit. Generating the indicator may include generating the indicator in response to the modulation signal and the demodulation signal.

INDUSTRIAL APPLICABILTIY

The inventions described herein relate to industrial and commercial industries, such as electronics and communications industries using devices that communicate with other devices or devices having communication between components in the devices.

It is believed that the disclosure set forth herein encompasses multiple distinct inventions with independent utility. While each of these inventions has been disclosed in its preferred form, the specific embodiments thereof as disclosed and illustrated herein are not to be considered in a limiting sense as numerous variations are possible. Each example defines an embodiment disclosed in the foregoing disclosure, but any one example does not necessarily encompass all features or combinations that may be eventually claimed. Where the description recites "a" or "a first" element or the equivalent thereof, such description includes one or more such elements, neither requiring nor excluding two or more such elements. Further, ordinal indicators, such as first, second or third, for identified elements are used to distinguish between the elements, and do not indicate a required or limited number of such elements, and do not indicate a particular position or order of such elements unless otherwise specifically stated.

What is claimed is:
1. A communication system comprising:
a first amplifier configured to receive a radio frequency input signal and generate a first amplified output signal having an extremely high frequency (EHF) component;
a transducer having a first terminal and a second terminal operatively coupled to receive the first amplified output signal from the first amplifier, the transducer configured to transform the first amplified output signal to an electromagnetic signal operating in the EHF band of the electromagnetic frequency spectrum; and
a proximity-sensing circuit, comprising:
a reference circuit comprising a second amplifier coupled to receive the radio frequency input signal and generate a second amplified output signal having an EHF component, and an impedance component coupled to receive the second amplified output signal, and a detection circuit configured to:
  detect a reference amplitude voltage between a first terminal and a second terminal of the impedance component,
  detect an amplitude of a composite signal voltage across the first terminal and the second terminal of the transducer,
  compare the detected reference amplitude voltage and the detected amplitude of the composite signal voltage, and
  generate an indication of proximity of the communication system to an object based on the comparison.

2. The system of claim 1, wherein the impedance component has a value equivalent to an impedance of the transducer when the object is in a reference position relative to a position of the transducer.

3. The system of claim 1, further comprising a first transformer coupled between an output of the first amplifier and the first and second terminals of the transducer.

4. The system of claim 1, further comprising a second transformer coupled between an output of the second amplifier and the first and second terminals of the impedance component.

5. The system of claim 1, wherein the transducer is an antenna.

6. The system of claim 1, wherein the impedance component is a resistor.

7. The system of claim 1, wherein the indication corresponds to an impedance change in the transducer caused by the presence of the object.

8. The system of claim 1, wherein the detection circuit is further configured to:
  compare a difference between the detected reference amplitude voltage and the detected amplitude of the composite signal voltage with a specified threshold reference level; and
  generate the indication of proximity of the communication system to the object based on the comparison of the difference between the detected reference amplitude voltage and the detected amplitude of the composite signal voltage with a specified threshold reference level.

9. The system of claim 1, wherein the first amplifier and the second amplifier are equivalent components.

10. The system of claim 1, wherein the first transformer and the second transformer are equivalent components.

11. A method comprising:
  receiving a radio frequency input signal;
  amplifying the input signal by a first amplifier to generate a first amplified output signal having an extremely high frequency (EHF) component;
  transforming, by a transducer, the first amplified output signal into an electromagnetic signal operating in the EHF band of the electromagnetic frequency spectrum;
  receiving, by a proximity-sensing circuit, the input signal;
  generating, by the proximity-sensing circuit, a second amplified output signal having an EHF component;
  detecting a reference amplitude voltage between a first terminal and a second terminal of an impedance component coupled to receive the second amplified output signal;
  detecting an amplitude of a composite signal voltage across a first terminal and a second terminal of the transducer;
  comparing the detected reference amplitude voltage and the detected amplitude of the composite signal voltage; and
  generating an indication of proximity of the communication system to an object based on the comparison.

12. The method of claim 11, wherein the impedance component has a value equivalent to an impedance of the transducer when the object is in a reference position relative to a position of the transducer.

13. The method of claim 11, wherein the transducer is an antenna.

14. The method of claim 11, wherein the impedance component is a resistor.

15. The method of claim 11, wherein the indication corresponds to an impedance change in the transducer caused by the presence of the object.

16. The method of claim 11, further comprising:
  comparing a difference between the detected reference amplitude voltage and the detected amplitude of the composite signal voltage with a specified threshold reference level; and
  generating the indication of proximity of the communication system to the object based on the comparison of the difference between the detected reference amplitude voltage and the detected amplitude of the composite signal voltage with a specified threshold reference level.

* * * * *

UNITED STATES PATENT AND TRADEMARK OFFICE
CERTIFICATE OF CORRECTION

PATENT NO. : 9,722,667 B2
APPLICATION NO. : 15/263362
DATED : August 1, 2017
INVENTOR(S) : Gary Davis McCormack et al.

It is certified that error appears in the above-identified patent and that said Letters Patent is hereby corrected as shown below:

In the Claims

Column 15, Line 45, change "a specified threshold" to --the specified threshold--.
Column 16, Line 46, change "a specified threshold" to --the specified threshold--.

Signed and Sealed this
Tenth Day of April, 2018

Andrei Iancu
*Director of the United States Patent and Trademark Office*